(12) United States Patent
Senda et al.

(10) Patent No.: US 7,256,774 B1
(45) Date of Patent: Aug. 14, 2007

(54) DISPLAY DEVICE

(75) Inventors: Takahiro Senda, Tenri (JP); Takao Muroi, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 547 days.

(21) Appl. No.: 10/700,463

(22) Filed: Nov. 5, 2003

(30) Foreign Application Priority Data

| Dec. 5, 2002 | (JP) | ............................. 2002-353828 |
| Aug. 12, 2003 | (JP) | ............................. 2003-207268 |

(51) Int. Cl.
*G09G 5/00* (2006.01)
*G09G 3/10* (2006.01)

(52) U.S. Cl. ...................... 345/204; 345/92; 315/169.3

(58) Field of Classification Search .......... 345/30–111, 345/204; 315/169.3; 365/230.06; 320/135, 320/166
See application file for complete search history.

(56) References Cited

U.S. PATENT DOCUMENTS

| 6,583,775 | B1 | 6/2003 | Sekiya et al. |
| 6,847,193 | B2 * | 1/2005 | Sakuragi ..................... 320/166 |
| 7,061,186 | B2 * | 6/2006 | Inukai et al. ............ 315/169.3 |
| 2002/0075208 | A1 * | 6/2002 | Bae et al. ...................... 345/76 |
| 2003/0030602 | A1 * | 2/2003 | Kasai ........................... 345/76 |
| 2003/0227278 | A1 * | 12/2003 | Sakuragi ..................... 320/135 |
| 2004/0135779 | A1 * | 7/2004 | Inukai ......................... 345/204 |
| 2005/0157581 | A1 * | 7/2005 | Shiurasaki et al. .... 365/230.06 |

FOREIGN PATENT DOCUMENTS

| WO | WO 98/48403 | 10/1998 |
| WO | WO 99/65011 | 12/1999 |

OTHER PUBLICATIONS

Johnson et al., "Active Matrix PolyLED Displays", IDW '00, pp. 235-238.

* cited by examiner

*Primary Examiner*—Sumati Lefkowitz
*Assistant Examiner*—Srilakshmi K Kumar
(74) *Attorney, Agent, or Firm*—Nixon & Vanderhye P.C.

(57) ABSTRACT

Each pixel includes: a first wiring for allowing a current to flow to an organic EL element; a first TFT element, provided in series to the organic EL element so as to be positioned in a path for allowing the current to flow from the first wiring, which has a control terminal for controlling conductance of the first TFT element; a second TFT element, provided in series to the organic EL element and the first TFT element so as to be positioned in the path, which has a control terminal for allowing/disallowing conduction; a capacitor which applies a voltage corresponding to stored electric charge to the control terminal of the first TFT element as a control voltage for controlling the conductance of the first TFT element; a third TFT element, provided in a path for supplying the electric charge to the capacitor, which has a control terminal for allowing/disallowing conduction, said third TFT element causing the capacitor to store the electric charge by disallowing conduction; a second wiring which applies a control voltage to the control terminal of the second TFT element; and a third wiring which applies a control voltage to the control terminal of the third TFT element. Thus, it is possible to enlarge an area of a transparent electrode.

8 Claims, 18 Drawing Sheets

DISPLAY DEVICE

FIELD OF THE INVENTION

The present invention relates to a display device, such as an organic EL (Electro Luminescence) display and an FED (Field Emission Display) display, which uses current-driving-type electro-optic elements.

BACKGROUND OF THE INVENTION

Recently, an organic EL display and an FED display have been being studied and developed. Particularly, the organic EL display attracts attentions as a display used in a portable device, such as a cellular phone and PDA (Personal Digital Assistants), which can emit light at a lower voltage and with lower power consumption.

As to the organic EL display, a simple matrix type was introduced into the market, but an active matrix type will be mainly sold in the future. An organic EL active element can be realized by using an amorphous silicon TFT, but there is a tendency to use a smaller TFT, such as a monocrystal silicon TFT, a polysilicon TFT, and a CG (Continuous Grain) silicon TFT, which can be formed with a driving circuit at the same time and can drive the organic EL (that is, mobility of the TFT is high). Particularly, a low temperature polysilicon TFT and a CG silicon TFT which can be formed on a glass substrate are preferably used as materials for a direct view display.

As referred to in "Active Matrix Addressing of Polymer Light Emitting Diode Using Low Temperature Poly Silicon TFTs", AM-LCD 2000 pp 249-252 (hereinafter, referred to as Document 1) and the like, a pixel circuit of the active matrix type organic EL using the low temperature polysilicon or the CG silicon basically includes two TFT elements Qa and Qb, a capacitor Ca, and an organic EL element ELa as shown in FIG. 13.

That is, the driving TFT element Qb is disposed in series with the organic EL element ELa between a power source wiring Vref and a power source terminal Vcom, and the capacitor Ca is disposed between a gate terminal and a source terminal of the driving TFT element Qb, and the source terminal is connected to the power source wiring Vref. Further, a gate terminal of the selecting TFT element Qa is connected to a gate wiring Gi, and a source/drain terminal is disposed so as to connect a source wiring Sj to the gate terminal of the driving TFT element Qb. A voltage is inputted from the source wiring Sj to the capacitor Ca under such condition that the selecting TFT element Qa conducts (ON state). As a result, conductance of the driving TFT element Qb is controlled, so that a current flowing to the organic EL element ELa is controlled, thereby controlling luminance of the pixel. Thereafter, a potential of the capacitor Ca is maintained under such condition that the selecting TFT element Qa does not conduct (OFF state), so that the conduction state of the driving TFT element Qb is maintained, thereby keeping the luminance of the pixel.

The luminance of the organic EL element is in proportion to a value of the current flowing to the organic EL element, so that the foregoing arrangement raises such a problem that: when an applied voltage/current property of the organic EL element ELa varies, the value of the current flowing to the organic EL element ELa varies.

FIG. 14 shows a pixel circuit arrangement shown in "Active Matrix PolyLED Displays", IDW 00 pp 235-238 (hereinafter, referred to as Document 2). In the circuit arrangement shown in FIG. 14, a switching TFT element Qc is disposed between the driving TFT element Qb and the organic EL element ELa, and the selecting TFT element Qa is disposed between (i) a connection point of the driving TFT element Qb and the switching TFT element Qc and (ii) the source wiring Sj, and a switching TFT element Qd is disposed between the selecting TFT element Qa and the capacitor Ca. A gate terminal of the selecting TFT element Qa and gate terminals of the switching TFT elements Qc and Qd are connected to a gate wiring Gi.

In this arrangement, the selecting TFT element Qa and the switching TFT element Qd are turned ON under such condition that the switching TFT element Qc is turned OFF, so that a current flows from the power source wiring Vref to the source wiring Sj. An amount of the current is controlled by a current source of a source driving circuit (not shown), so that a gate voltage of the driving TFT element Qb is set so that a current whose amount has been determined by the source driving circuit flows to the driving TFT element Qb regardless of a threshold value voltage/mobility of the driving TFT element Qb. Further, the switching TFT element Qc is turned ON under such condition that the selecting TFT element Qa and the switching TFT element Qd are turned OFF, so that the capacitor Ca's potential at this time is maintained, thereby controlling the driving TFT element Qb so as to flow a predetermined amount of the current to the organic EL element ELa.

Further, FIG. 15 shows a pixel circuit arrangement shown in Japanese National Publication of Translated Patent No. 514320/2002 (Tokuhyo 2002-514320)(Publication date: May 14, 2002) (International Publication Number: WO 98/48403) (hereinafter, referred to as Document 3). In the circuit arrangement shown in FIG. 15, a switching TFT element Qg is disposed between the driving TFT element Qb and the power source wiring Vref, and a switching TFT element Qf is disposed between the driving TFT element Qb and the source wiring Sj, and a selecting TFT element Qe is disposed between the organic EL element ELa and the capacitor Ca. Gate terminals of the switching TFT elements Qf and Qg and a gate terminal of the selecting TFT element Qe are connected to the gate wiring Gi.

In this arrangement, the selecting TFT element Qe and the switching TFT element Qf are turned ON under such condition that the switching TFT element Qg is turned OFF, so that a current flows from the source wiring Sj to the organic EL element ELa. An mount of the current is controlled by a current driving circuit Pj of the source driving circuit (not shown), so that a gate terminal voltage of the driving TFT element Qb is set so that a current whose amount has been determined by the source driving circuit flows to the driving TFT element Qb regardless of a threshold value voltage/mobility of the driving TFT element Qb. Further, the switching TFT element Qg is turned ON under such condition that the switching TFT element Qf and the selecting TFT element Qe are turned OFF, so that the capacitor Ca's potential at this time is maintained, thereby controlling the driving TFT element Qb so as to allow a predetermined amount of the current to flow to the organic EL element ELa.

Note that, an arrangement of the CG silicon TFT is mentioned in "4.0-in. TFT-OLED Displays and a Novel Digital Driving Method (Semiconductor Energy Research Institute)" (hereinafter, referred to as Document 4) of SID'00 Digest pp. 924-927, and the like. Further, the CG silicon TFT process is mentioned in "Continuous Grain Silicon Technology and Its Applications for Active Matrix Display (Semiconductor Energy Research Institute)" (hereinafter, referred to as Document 5) of AM-LCD 2000 pp. 25-28, and the like. Further, the arrangement of the organic EL element is mentioned in "Polymer Light-Emitting Diodes for use in Flat Panel Display" (hereinafter, referred to as Document 6) of AM-LCD '01 pp 211-214, and the like.

However, in Documents 2 and 3, the driving TFT element Qb which functions as an active element for driving the organic EL element ELa by supplying a current having a predetermined value via the source wiring Sj during a selection period is arranged so that a gate terminal potential of the driving TFT element Qb is set, so that a value of a current flowing to the organic EL element ELa is determined on the basis of the current whose value has been determined. Thus, even when the applied voltage/current property of the organic EL element ELa varies, the value of the current flowing to the organic EL element ELa does not vary, which brings about such advantage that the luminance hardly varies.

However, the pixel circuit arrangement in Documents 2 and 3 is a 4-TFT pixel circuit arrangement in which a single organic EL element requires a capacitor, four TFT elements, a power source wiring, a source wiring, and a gate wiring. Thus, in the 4-TFT pixel circuit arrangement, an area occupied by the capacitor and the TFT elements is increased, so that an area occupied by a transparent electrode such as ITO for forming the organic EL element (that is, an anode area) is reduced. Particularly, minimum values of a TFT element size and a wiring width are determined on the basis of a process rule. Thus, even when the pixel size is reduced, it is impossible to make the TFT element size and the wiring width smaller.

Therefore, in a case of manufacturing a high definition panel of not less than 100 ppi, the 4-TFT pixel circuit arrangement shown in FIG. 14 or FIG. 15 causes the area occupied by the transparent electrode to be not more than half of the area of a 2-TFT pixel circuit arrangement shown in FIG. 13.

Further, a power source voltage preferably used to obtain a predetermined luminance varies depending on respective dots of RGB, so that it is desirable to prepare the power source wirings Vref different from each other corresponding to respective colors of RGB. In this case, the respective colors of RGB are disposed along the power source wirings Vref, and as shown in FIG. 16, a pixel circuit Aij is divided into three portions by the power source wirings Vref, so that the dots of RGB are formed. However, also the source wirings Sj are formed in parallel to the power source wirings Vref, so that wirings which exist in the pixel circuit Aij include: three power source wirings Vref, three source wirings Sj, and a gate wiring Gi.

As a result, a display device having the pixel circuit shown in FIG. 14 or FIG. 15 is such that: as shown in FIG. 16, besides a TFT area 7 and an area of the gate wiring Gi, there is a pixel area (RGB dots 9, 10, and 11 constitute a single pixel) which cannot be used to emit light due to the source wirings Sj, and the pixel area is so large that: pixel length×(source wiring width Y [μm]+process blank P [μm]× 3. Here, pixel length=length of dots of RGB=width×[μm] of each dot of RGB×3. As a result, the foregoing arrangement raises such a problem that: an ITO area 8, that is, an area for forming the transparent electrode is made extremely small.

SUMMARY OF THE INVENTION

The present invention was made so as to solve the foregoing problems, and its object is to provide a display device, having a pixel circuit arrangement for allowing a current whose value has been set to an electro-optic element, which enables a wider area of a transparent electrode to be provided.

In order to solve the foregoing problems, the display device of the present invention sets a value of a current allowed to flow to an electro-optic element of each pixel so as to drive the electro-optic element on the basis of the current, wherein the pixel includes: a first wiring for allowing the current to flow to the electro-optic element; a first active element, provided in series to the electro-optic element so as to be positioned in a path for allowing the current to flow from the first wiring to the electro-optic element, which has a control terminal for controlling conductance of the first active element; a second active element, provided in series to the electro-optic element and the first active element so as to be positioned in the path, which has a control terminal for allowing/disallowing conduction; an electric charge retaining section for storing electric charge so as to apply a voltage corresponding to thus stored electric charge to the control terminal of the first active element as a control voltage for controlling the conductance of the first active element; a third active element, provided in a path for supplying the electric charge to the electric charge retaining section, which has a control terminal for allowing/disallowing conduction, said third active element causing the electric charge retaining section to retain the electric charge by disallowing conduction; a second wiring for applying a control voltage for allowing/disallowing conduction to the control terminal of the second active element; and a third wiring for applying a control voltage for allowing/disallowing conduction the third active element to the control terminal of the third active element.

According to the invention, in each pixel, when the second and third active elements are made to conduct by applying control voltages from the second and third wirings to the control terminals thereof, it is possible to allow a current having a predetermined value to flow from the first wiring to the electro-optic element via the first active element. At this time, electric charge corresponding to the current having the foregoing value is stored in the electric charge retaining section, and thereafter, the third active element is disallowed to conduct by applying the control voltage from the third wiring, so that the electric charge retaining section retains the electric charge so that the control voltage allowing the current having the foregoing value to flow to the first active element is applied to the control terminal of the first active element. Thus, it is possible to set the value of the current allowed to flow to the electro-optic element.

Further, when the second active element is disallowed to conduct by applying the control voltage from the second wiring, it is possible to stop the current from flowing to the electro-optic element under such condition that the electric charge retaining section retains the electric charge. During the period, it is possible to set the value of the current allowed to flow to the electro-optic element in other pixel connected to the first wiring for example. When the value of the current flowing to the electro-optic element in each pixel is set and the second active element is made to conduct again in this manner, it is possible to drive the electro-optic element on the basis of the current whose value has been set.

In the foregoing arrangement, a single pixel includes three active elements, an electric charge retaining section such as a capacitor, and three wirings. Further, it is possible to provide the second and third wirings so as to be shared in RGB pixels in a case of a color display device. Thus, it is possible to omit one active element required in a conventional 4-TFT pixel circuit arrangement which includes four TFT elements, a capacitor, a power source wiring, a source wiring, and a gate wiring, so that it is possible to enlarge an area of the transparent electrode. Further, in the conventional 4-TFT pixel circuit arrangement, even though the gate wiring can be shared in the RGB pixels in the case of the color display device, the pixels respectively require the source wirings. However, in the present invention, it is not necessary to provide the source wirings, so that it is possible to further enlarge the area of the transparent electrode.

As a result, it is possible to provide a display device, having a pixel circuit arrangement for allowing a current whose value has been set to an electro-optic element, which enables a wider area of a transparent electrode to be provided. Further, due to this arrangement, it is possible to drop the emission luminance required in the organic EL element for obtaining the same display luminance, thereby making the life of the organic EL element longer.

Further, in order to solve the foregoing problems, the display device of the present invention sets a value of a current allowed to flow to an electro-optic element of each pixel so as to drive the electro-optic element on the basis of the current, wherein the pixel includes: a first wiring for allowing the current to flow to the electro-optic element; a first active element, provided in series to the electro-optic element so as to be positioned in a path for allowing the current to flow from the first wiring to the electro-optic element, which has a control terminal for controlling conductance of the first active element; a second active element, provided in series to the electro-optic element and the first active element so as to be positioned in the path, which has a control terminal for allowing/disallowing conduction; an electric charge retaining section for storing electric charge so as to apply a voltage corresponding to thus stored electric charge to the control terminal of the first active element as a control voltage for controlling the conductance of the first active element; a third active element, provided in a path for supplying the electric charge to the electric charge retaining section, which has a control terminal for allowing/disallowing conduction, said third active element causing the electric charge retaining section to retain the electric charge by disallowing conduction; a second wiring for applying a control voltage for allowing/disallowing conduction to the control terminal of the second active element; a third wiring for applying a control voltage for allowing/disallowing conduction to the control terminal of the third active element; and a fourth active element, provided between (i) a connection point of the first active element and the second active element and (ii) the second wiring, said fourth active element having a control terminal, connected to the third wiring, which allows/disallows conduction.

According to the invention, in each pixel, when the third and fourth active elements are made to conduct by applying control voltages from the second and third wirings to the control terminals thereof, it is possible to allow a current having a predetermined value to flow from the first wiring to the first active element. At this time, electric charge corresponding to the current having the foregoing value is stored in the electric charge retaining section, and thereafter, the third active element is disallowed to conduct by applying the control voltage from the third wiring, so that the electric charge retaining section retains the electric charge so that the control voltage allowing the current having the foregoing value to flow to the first active element is applied to the control terminal of the first active element. Thus, it is possible to set the value of the current allowed to flow to the electro-optic element.

Further, during a period in which the third active element is disallowed to conduct, also the fourth active element is disallowed to conduct, so that it is possible to set the value of the current allowed to flow to an electro-optic element of other pixel connected to the same first wiring. When the value of the current flowing to the electro-optic element in each pixel and the second active element is made to conduct, so that it is possible to drive the electro-optic element on the basis of the current whose value has been set.

In the foregoing arrangement, a single pixel includes four active elements, an electric charge retaining section such as a capacitor, and three wirings. Further, it is possible to provide the second and third wirings so as to be shared in RGB pixels in a case of a color display device. In a conventional 4-TFT pixel circuit arrangement which includes four TFT elements, a capacitor, a power source wiring, a source wiring, and a gate wiring, even though the gate wiring can be shared in the RGB pixels in the case of the color display device, the pixels respectively require the source wirings. However, in the present invention, it is not necessary to provide the source wirings, so that it is possible to further enlarge the area of the transparent electrode.

As a result, it is possible to provide a display device, having a pixel circuit arrangement for allowing a current whose value has been set to an electro-optic element, which enables a wider area of a transparent electrode to be provided. Further, due to this arrangement, it is possible to drop the emission luminance required in the organic EL element for obtaining the same display luminance, thereby making the life of the organic EL element longer.

Further, in order to solve the foregoing problems, the display device of the present invention sets a value of a current allowed to flow to an electro-optic element of each pixel so as to drive the electro-optic element on the basis of the current, wherein the pixel includes: a firstly-ordered wiring for allowing the current to flow to the electro-optic element; a firstly-ordered active element, provided in series to the electro-optic element so as to be positioned in a path for allowing the current to flow from the first wiring to the electro-optic element, which has a control terminal for controlling conductance of the firstly-ordered active element; an electric charge retaining section for storing electric charge so as to apply a voltage corresponding to thus stored electric charge to the control terminal of the firstly-ordered active element as a control voltage for controlling the conduction of the firstly-ordered active element; a secondly-ordered active element, provided in a path for supplying the electric charge to the electric charge retaining section, which has a control terminal for allowing/disallowing conduction, said secondly-ordered active element causing the electric charge retaining section to retain the electric charge by disallowing conduction; a secondly-ordered wiring for applying a control voltage for allowing/disallowing conduction to the control terminal of the secondly-ordered active element; and a thirdly-ordered wiring for providing a reference voltage, which is a fraction of the voltage corresponding to the electric charge stored in the electric charge retaining section, to the electric charge retaining section.

According to the invention, in each pixel, when the secondly-ordered active element is made to conduct by applying the control voltage from the secondly-ordered wiring to the control terminal of the secondly-ordered active element, the path for supplying the electric charge to the electric charge retaining section can supply the electric charge. The electric charge retaining section stores the electric charge so as to provide a voltage corresponding to the stored electric charge to the control terminal of the firstly-ordered active element as the control voltage for controlling the conductance of the firstly-ordered active element. At this time, when a predetermined current is allowed to flow from the firstly-ordered wiring to the electro-optic element via the firstly-ordered active element, the electric charge retaining section stores the electric charge corresponding to the predetermined current. Further, when the secondly-ordered active element is disallowed to conduct by applying the control voltage from the secondly-ordered wiring, the electric charge retaining section retains the electric charge. Thus, it is possible to set the value of the current allowed to flow to the electro-optic element.

Here, the thirdly-ordered wiring provides the reference voltage which is a fraction of the voltage corresponding to the electric charge stored in the electric charge retaining section. When the reference voltage is appropriately varied, the conduction of the firstly-ordered active element is substantially disallowed under such condition that the electric charge retaining section retains the electric charge, so that it is possible to stop the current from flowing to the electro-optic element. During this period, it is possible to set the value of the current allowed to flow to an electro-optic element of other pixel connected to the same firstly-ordered wiring for example. When the value of the current allowed to flow to the electro-optic element is set in each pixel and the reference voltage provided by the thirdly-ordered wiring is restored to a condition enabling the path for supplying the electric charge to supply the electric charge to the electric charge retaining section while keeping the secondly-ordered active element OFF in this manner, it is possible to drive the electro-optic element on the basis of the current whose value has been set.

In the foregoing arrangement, a single pixel includes two active elements, an electric charge retaining section such as a capacitor, and three wirings. Further, it is possible to provide the secondly-ordered and thirdly-ordered wirings so as to be shared in RGB pixels in a case of a color display device. Thus, it is possible to omit two active elements required in a conventional 4-TFT pixel circuit arrangement which includes four TFT elements, a capacitor, a power source wiring, a source wiring, and a gate wiring, so that it is possible to enlarge an area of the transparent electrode. Further, in the conventional 4-TFT pixel circuit arrangement, even though the gate wiring can be shared in the RGB pixels in the case of the color display device, the pixels respectively require the source wirings. However, in the present invention, it is not necessary to provide the source wirings, so that it is possible to further enlarge the area of the transparent electrode.

As a result, it is possible to provide a display device, having a pixel circuit arrangement for allowing a current whose value has been set to an electro-optic element, which enables a wider area of a transparent electrode to be provided. Further, due to this arrangement, it is possible to drop the emission luminance required in the organic EL element for obtaining the same display luminance, thereby making the life of the organic EL element longer.

Further, the display device of the present invention sets a value of a current allowed to flow to an electro-optic element of each pixel so as to drive the electro-optic element on the basis of the current, wherein the pixel includes: a wiring for allowing the current to flow to the electro-optic element; an active element, provided in series to the electro-optic element so as to be positioned in a path for allowing the current to flow from the wiring to the electro-optic element, which has a control terminal for controlling conductance of the active element; and an electric charge retaining section for storing electric charge so as to apply a voltage corresponding to thus stored electric charge to the control terminal of the active element as a control voltage for controlling the conductance of the active element, and said display device includes: a current source circuit which outputs a constant current to the wiring so as to perform a first operation in which the electric charge retaining section is made to store electric charge corresponding to the current which has been allowed to flow to the active element so that a circuit of the pixel memorizes the current; and a voltage source circuit which outputs a low voltage so as to perform a second operation, in which the current memorized in the circuit is allowed to flow to the electro-optic element via the active element, after performing the first operation, said current source circuit and said voltage source circuit being provided in a switchable manner.

According to the invention, when the current source circuit is connected to the wiring so as to allow the constant current to flow to the active element, the electric charge retaining section connected to the control terminal of the active element stores the electric charge so that the control voltage causing the constant current to flow to the active element is applied to the control terminal of the active element. Thus, when the constant current is set as a current allowed to flow to the electro-optic element, the circuit of the pixel memorizes the current by performing the first operation, so that the electric charge retaining section stores the electric charge corresponding to the constant current flowing to the active element. As a result, it is possible to set the value of the current allowed to flow to the electro-optic element of the pixel. Next, when the current source circuit connected to the wiring is switched to the voltage source circuit, the current memorized by the circuit of the pixel flows to the electro-optic element via the active element by performing the second operation after the first operation, so that it is possible to drive the electro-optic element on the basis of the current whose value has been set.

In this manner, the wiring functions as both a power source wiring and a source wiring each of which is required in each circuit of the pixel, it is possible to reduce the number of wirings, so that this arrangement is useful in enlarging the area of the transparent electrode.

As a result, it is possible to provide a display device, having a pixel circuit arrangement for allowing a current whose value has been set to an electro-optic element, which enables a wider area of a transparent electrode to be provided. Particularly in an arrangement in which light is emitted from the side of a substrate where the switching element is disposed, that is, in a pixel circuit of a bottom emission arrangement, it is possible to enlarge the area of the transparent electrode.

For a fuller understanding of the nature and advantages of the invention, reference should be made to the ensuing detailed description taken in conjunction with the accompanying drawings.

DESCRIPTION OF THE EMBODIMENTS

The following various embodiments will detail the present invention.

Each switching element used in the present invention can be constituted of a low temperature polysilicon TFT or a CG silicon TFT. In the present embodiment, the CG silicon TFT is used.

Note that, since an arrangement of the CG silicon TFT is mentioned in Document 4 and the like, detail description thereof is omitted.

Further, since the CG silicon TFT process is mentioned in Document 5 and the like, detail description thereof is omitted.

Further, since an arrangement of the organic EL element which is an electro-optic element used in the following embodiments is mentioned in Document 6 and the like, detail description thereof is omitted.

Embodiment 1

The following description will explain one embodiment with reference to FIG. 1 to FIG. 4.

Figure 1:
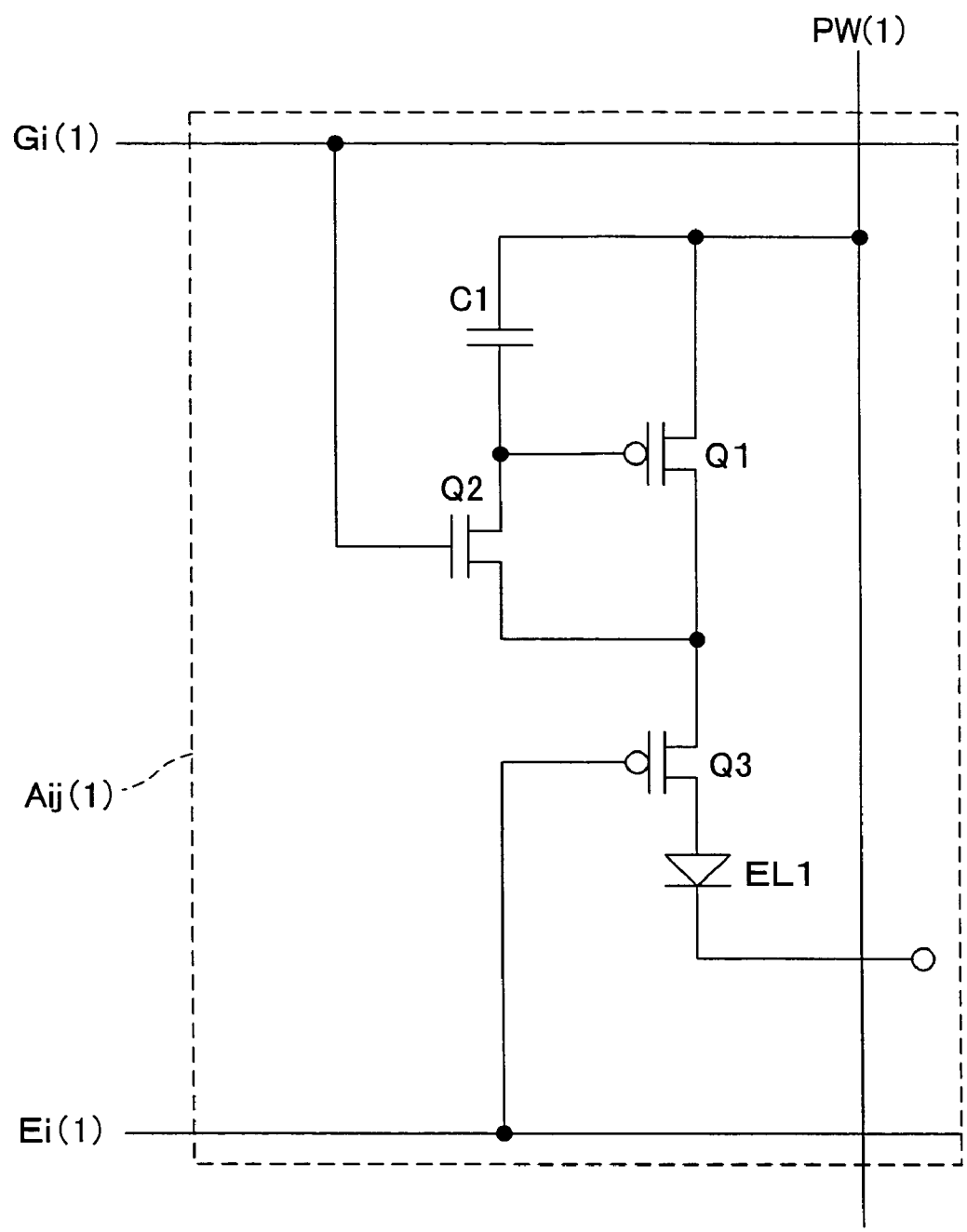
FIG. 1 is a circuit diagram showing an arrangement of a pixel circuit provided on a display device according to Embodiment 1 of the present invention.

FIG. 1 shows a pixel circuit Aij (1) of a display device according to the present embodiment. The pixel circuit Aij (1) shows a single pixel, and if there are RGB pixels, the pixel circuit Aij (1) shows a single combination of the RGB pixels.

The pixel circuit Aij (1) includes: a current-driving-type organic EL element EL1; p-type TFT elements Q1 and Q3; an n-type TFT element Q2; a capacitor C1; a gate wiring Gi (1); a power source wiring which functions also as a source wiring (hereinafter, referred to as power source wiring) PW (1); and a control wiring Ei (1).

The TFT element (first active element, active element) Q1 and the capacitor (electric charge retaining means) C1 are connected to the power source wiring (first wiring, wiring) PW (1). The capacitor C1 is disposed between a gate terminal and a source terminal of the TFT element Q1. The TFT element (second active element) Q3 and the organic EL element (electro-optic element) EL1 are connected to each other in series to the TFT element Q1 so that the TFT element Q3 is positioned on the side of the TFT element Q1. A gate terminal of the TFT element Q3 is connected to the control wiring (second wiring) Ei (1). The organic EL element EL1 is disposed so that its anode is positioned on the side of the TFT element Q3.

Further, the TFT element (third active element) Q2 is disposed between (i) the gate terminal of the TFT element Q1 and (ii) a connection point of the TFT element Q1 and the TFT element Q3. A gate terminal of the TFT element Q2 is connected to the gate wiring (third wiring) Gi (1).

The display device according to the present embodiment is arranged so that: in each pixel, a value of a current flowing to the organic EL element EL1 is set by using the foregoing elements and wirings, so as to drive the organic EL element EL1 on the basis of the current whose value has been set. The power source wiring PW (1) is a wiring for allowing a current to flow to the organic EL element EL1. Thus, as apparent from the foregoing description, the TFT element Q1 is provided in series to the organic EL element EL1 so as to be positioned in a path for allowing the current to flow from the power source wiring PW (1) to the organic EL element EL1, and its gate functions as a control terminal which controls the conductance. The lower the voltage applied to the gate is, the smaller the conductance is. The higher the voltage applied to the gate is, the larger the conductance is. Further, the TFT element 3 is a switching element provided in series to the organic EL element EL1 and the TFT element Q1 so as to be positioned in the foregoing path, and its gate terminal functions as a control terminal for allowing/stopping the conduction. When a low voltage is applied to the gate terminal, the TFT element Q3 conducts, and a high voltage is applied to the gate terminal, the TFT element Q3 does not conduct.

The capacitor C1 applies a voltage corresponding to stored electric charge to the gate terminal of the TFT element Q1 as a control voltage for controlling the conductance of the TFT element Q1. The TFT element Q2 is a switching element which is provided in a path for supplying the electric charge to the capacitor $C_1$, and its gate terminal functions as a control terminal for allowing/stopping the conduction. When a high voltage is applied to the gate terminal, the TFT element Q2 conducts. When a low voltage is applied to the gate terminal, the TFT element Q2 does not conduct. The TFT element Q2 can supply the electric charge to the capacitor C1 while it conducts, and the capacitor C1 retains the stored electric charge.

Further, the control wiring Ei (1) and the gate wiring Gi (1) cross the power source wiring PW (1) at right angle in each pixel, and the control wiring Ei (1) applies a voltage determining a switching condition of the TFT element Q3

(control voltage for allowing/stopping the conduction) to the gate terminal of the TFT element Q3, and the gate wiring Gi (1) applies a voltage determining a switching condition of the TFT element Q2 (control voltage for allowing/stopping the conduction) to the gate terminal of the TFT element Q2.

Figure 2:
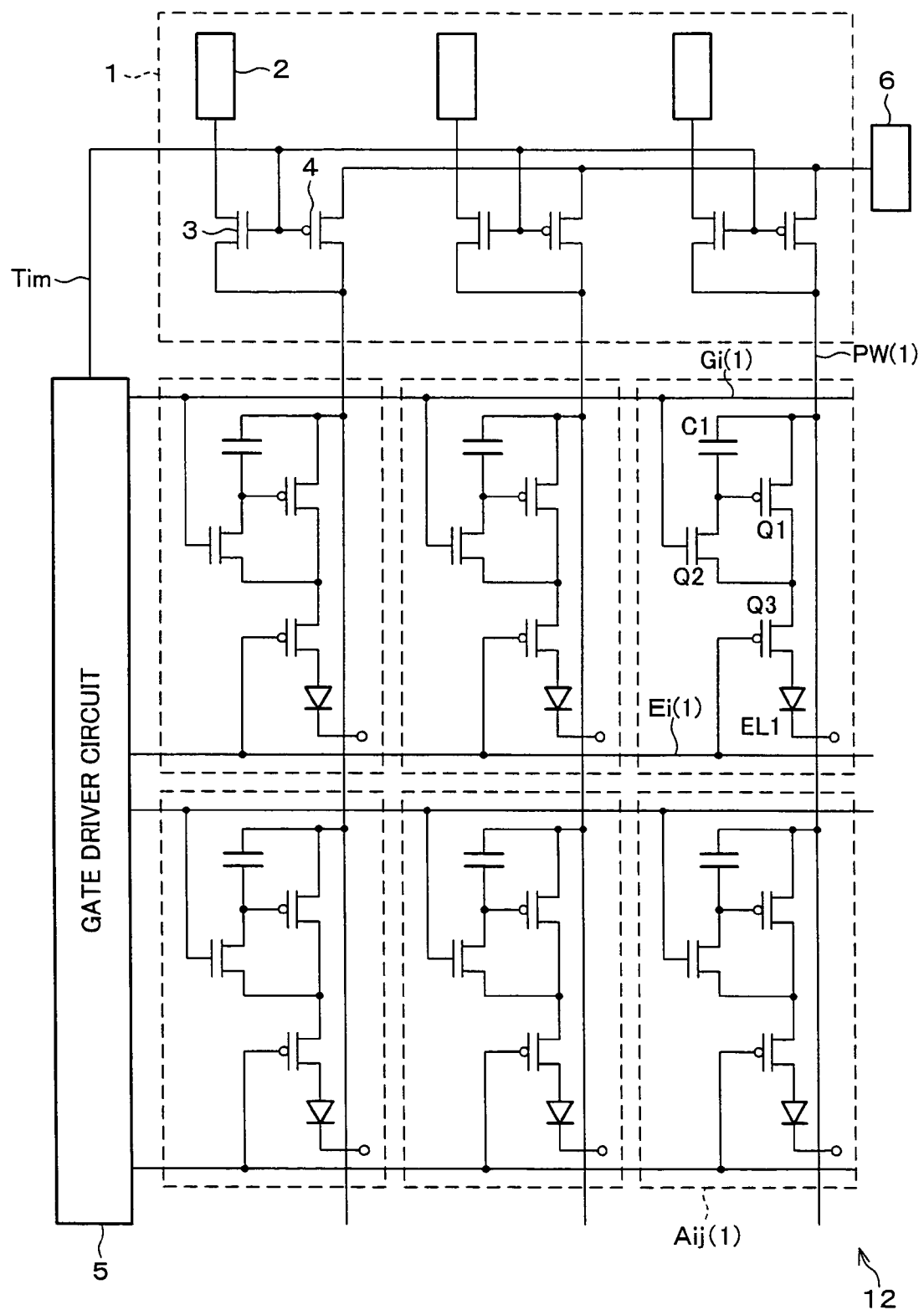
FIG. 2 is a circuit block diagram showing an arrangement of the display device according to Embodiment 1 of the present invention.

By disposing the pixel circuits Aij (1) in a matrix manner (m×n), it is possible to form the display device, but FIG. 2 shows a display device 12 obtained by disposing the pixel circuits Aij (1) in a matrix manner (3×2) so as to simplify the description.

The display device 12 is provided with a source driver 1, a gate driver circuit 5, and a voltage source circuit 6. In the display device 12, the gate wiring Gi (1) and the control wiring Ei (1) of each pixel circuit Aij (1) are connected to the gate driver circuit 5, and the power source wiring PW (1) is connected to the source driver circuit 1. The gate wiring Gi (1) and the control wiring Ei (1) are disposed in each row of the matrix, and they are shared by other pixels disposed in the same row. The power source wiring PW (1) is disposed in each column of the matrix, and it is shared by other pixels disposed in the same column. Further, a control wiring Tim is extended from the gate driver 5 to the source driver circuit 1.

The source driver circuit 1 includes a current source circuit 2 and switching elements 3 and 4. The switching element 3 is an n-type TFT, and the switching element 4 is a p-type TFT. In the source driver circuit 1, the power source wirings PW (1) are connected to the switching elements 3 and 4, and a switching element which is to be allowed to conduct is determined by a voltage outputted from the gate driver circuit 5 to the control wiring Tim. The control wiring Tim is connected to gate terminals of the switching elements 3 and 4. When a high voltage is outputted to the control wiring Tim, the switching element 3 conducts and the switching element 4 does not conduct. When a low voltage is outputted to the control wiring Tim, the switching element 3 does not conduct and the switching element 4 conducts.

Further, current source circuits 2 are respectively connected to the switching elements 3. When the switching element 3 conducts, the power source wiring PW (1) is connected to the current source circuit 2. The current source circuit 2 is controlled by a data wiring and a control wiring (not shown), and can output a current having various values. Here, the number of current values is two: 0 and other value for example. Further, the switching elements 4 are connected to a single power source circuit 6. When the switching element 4 conducts, the power source wiring PW (1) is connected to the power source circuit 6. In this manner, the current source circuit 2 and the power source circuit 6 are switched from each other, and each of them is connected to the power source wiring PW (1).

Figure 3:
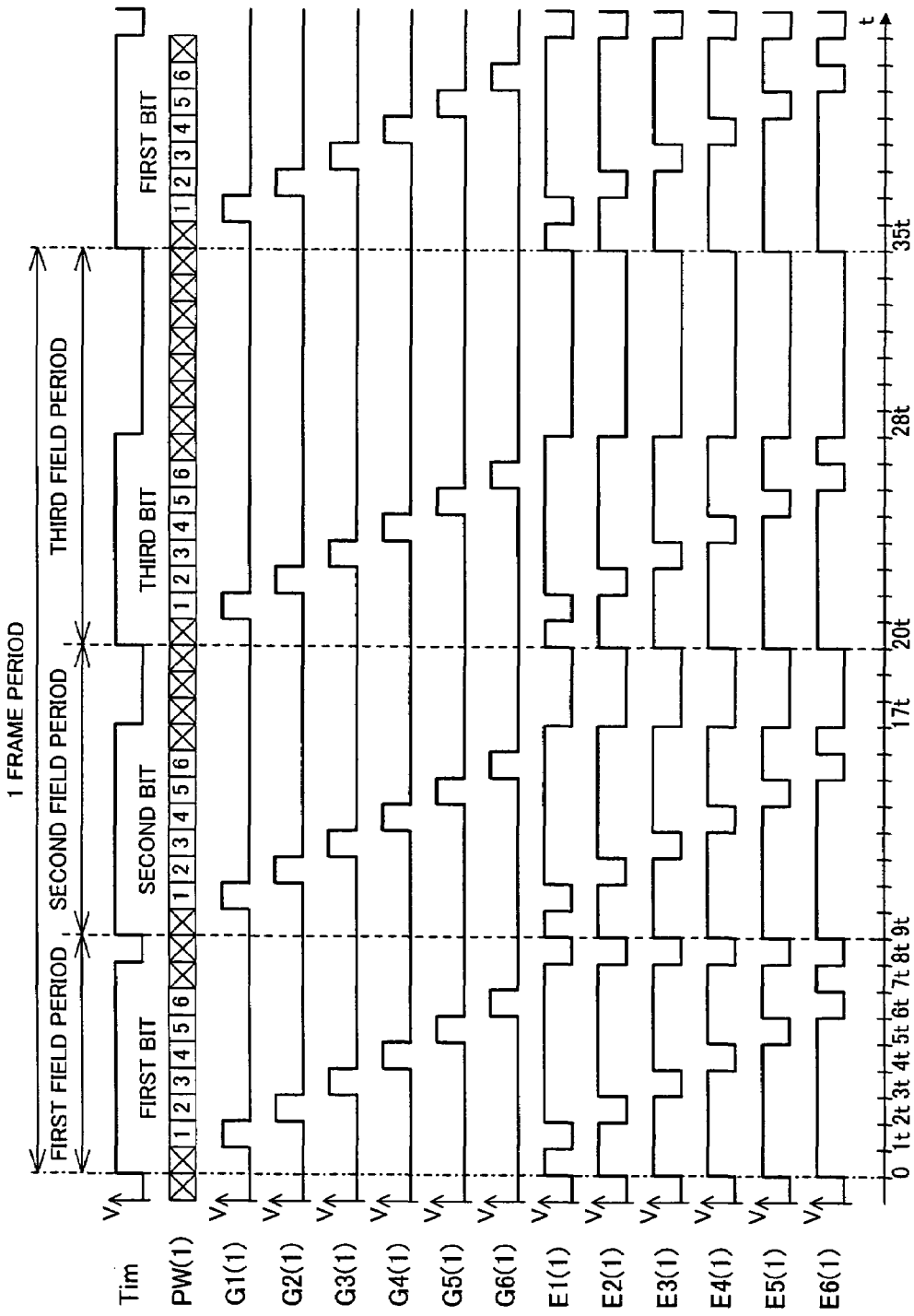
FIG. 3 is a timing chart showing operations of the display device according to Embodiment 1 of the present invention.

Next, the following description will explain how to drive the display device 12 with reference to FIG. 3. Note that, since illustration of only two gate wirings Gi (1) fails to clearly show the operations, FIG. 3 shows a case where there are six gate wirings Gi (1).

In FIG. 3, a horizontal axis represents a time, and a vertical axis represents voltages of the wirings.

As shown in FIG. 3, in the display device 12, one frame period is made of 35 t which ranges from 0 to 34 t. A first 9 t corresponds to a first field period, and a next 11 t corresponds to a second field period, and a last 15 t corresponds to a third field period. Further, during a period from 0 to 7 t in the first field period, a voltage of the control wiring Tim is high, so that the power source wiring PW (1) of FIG. 2 is connected to the current source circuit 2.

During this period, currents corresponding to the respective first bits are supplied from the current source circuit 2 to the pixel circuits A1j to A6j via the power source wiring PW (1). At this time, voltages of the gate wirings G1 (1) to G6 (1) sequentially become high at every it period in a corresponding manner as shown in FIG. 3, and voltages of the control wirings E1 (1) to E6 (1) sequentially become low at every it period in a corresponding manner as shown in FIG. 3. When the voltages of the gate wirings Gi (i) are high, the voltages of the control wirings E1 (1) are low. When the voltages of the gate wirings Gi (i) are low, the voltages of the control wirings Ei (1) are high.

When the voltages of the gate wirings Gi (1) are high and the voltages of the control wirings Ei (1) are low, the TFT element Q2 and the TFT element Q3 conduct in the pixel circuit Aij (1) of FIG. 1, so that a current supplied from the current source circuit 2 passes through the power source wiring PW (1), the TFT element Q1, and the TFT element Q3, to the organic EL element EL1.

At this time, a gate-source voltage of the TFT element Q1 is set so that the TFT element Q1 allows a current whose value has been determined to pass. This is based on the following reason: since more current is allowed to flow when a gate potential of the TFT element Q1 is low (when the gate-source voltage is large), a potential (source potential) of the power source wiring PW (1) drops, so that the gate-source voltage of the TFT element Q1 is adjusted so that a current supplied from the current source circuit 2 is allowed to flow. Further, this is based on also the following reason: since little current flows when the gate potential of the TFT element Q1 is high (when the gate-source voltage is low), a potential (source potential) of the power source wiring PW (1) rises, so that the gate-source voltage of the TFT element 1 is adjusted so that a current supplied from the current source circuit 2 is allowed to flow. The gate-source voltage of the TFT element 1 is set as an inter-terminal voltage of the capacitor C1.

Further, voltages of the gate wirings Gi (1) of the pixel circuit Aij (1) that has not been selected become low so that currents do not flow from the current source circuit 2 to two pixel circuits Aij (1), disposed in the same row, at the same time, and voltages of the control wirings Ei (1) become high. Thus, it is possible to set values of the currents which flow to the pixel circuits Aij (1) disposed in the same row. When setting of the current values is completed, a voltage of the gate wiring Gi (1) of the pixel becomes low, and a voltage of the control wiring Ei (1) becomes high. At this time, the TFT elements Q2 and Q3 are turned OFF. Thus, the capacitor C1 retains the inter-terminal voltage.

In this manner, a period in which voltages of the gate wirings Gi (1) of the pixel circuits Aij (1) are high and voltages of the control wirings Ei (1) are low at 0 to 8 t in the first field period is a period for performing a first operation in which the current source circuit 2 is connected to the power source wiring PW (1) so as to set values of currents flowing to the organic EL elements EL1 of the respective pixels. The first operation is also such that: in order to make the pixel circuits Aij (1) store the currents which are allowed to flow to the organic EL elements EL1, the current is allowed to flow to the TFT element Q1 so as to cause the capacitor C1 to store electric charge in accordance with the current.

Further, a voltage of the control wiring Tim is low at 8 t in the first field period, so that the power source wiring PW (1) of FIG. 2 is connected to the voltage source circuit 6. At this time, voltages of the control wirings Ei (1) at all once become low under such condition that voltages of the gate wirings Gi (1) of the pixel circuit Aij (1) remain low. As a result, a current whose value has been set by the TFT element Q1 of each pixel circuit Aij (1) is allowed to flow from the voltage source circuit 6 to the organic EL element EL1. At this time, the TFT element Q2 remains OFF, and the TFT element Q3 conducts. Further, at this time, a current whose value has been set is allowed to flow to the organic EL element EL1 of each pixel regardless of a driving condition of the organic EL element EL1 of other pixel, that is, regardless of whether or not to allow the current to flow.

In this manner, 8 t in the first field period is a period for performing a second operation in which the voltage source circuit 6 is connected to the power source wiring PW (1) so as to allow a current, whose value has been set by performing the first operation, to flow to the organic EL element EL1 of each pixel. The second operation is also such that: after performing the first operation, a current stored in each pixel circuit Aij (1) is allowed to flow to the organic EL element EL1 via the TFT element Q1.

Next, in the second field period, a voltage of the control wiring Tim is high during a period of 9 t to 16 t, so that the power source wiring PW (1) of FIG. 2 is connected to the current source circuit 2. During this period, currents each of which corresponds to the second bit in each pixel Aij are supplied from the current source circuit 2 to the pixel circuits A1j to A6j via the power source wiring PW (1). At this time, voltages of the gate wirings G1 (1) to G6 (1) sequentially become high at every it period in a corresponding manner as shown in FIG. 3, and voltages of the control wirings E1 (1) to E6 (1) sequentially become low at every it period in a corresponding manner as shown in FIG. 3. When voltages of the gate wirings Gi (1) are high, voltages of the control wirings Ei (1) are low. When voltages of the gate wirings Gi (1) are low, voltages of the control wirings Ei (1) are high.

In this manner, a period in which a voltage of the gate wiring Gi (1) of each pixel circuit Aij (1) is high and a voltage of the control wiring Ei (1) is low at 9 t to 16 t in the second field period is a period for performing the first operation in which the current source circuit 2 is connected to the power source wiring PW (1) so as to set a value of a current allowed to flow to the organic EL element EL1 of each pixel.

Further, a voltage of the control wiring Tim is low during a period of 17 t to 19 t in the second field period, so that the power source wiring PW (1) of FIG. 2 is connected to the voltage source circuit 6. At this time, voltages of the control wirings Ei (1) at all once become low under such condition that a voltage of the gate wiring Gi (1) of each pixel circuit Aij (1) remains low, so that the voltage source circuit 6 allows a current whose value has been set by the TFT element Q1 of each pixel circuit Aij (1) to flow to the organic EL element EL1. Further, at this time, a current whose value has been set is allowed to flow to the organic EL element EL1 of each pixel regardless of a driving condition of the organic EL element EL1 of other pixel, that is, regardless of whether or not to allow the current to flow.

In this manner, a period of 17 t to 19 t in the second field period is a period for performing the second operation in which the voltage source circuit 6 is connected to the power source wiring PW (1) so as to cause a current, whose value has been set by performing the first operation, to flow to the organic EL element EL1 of each pixel.

Lastly, in the third field period, a voltage of the control wiring Tim is high during a period of 20 t to 27 t, so that the power source wiring PW (1) of FIG. 2 is connected to the current source circuit 2. During this time, currents each of which corresponds to the third bit in each pixel circuit Aij are supplied from the current source circuit 2 to the pixel circuits A1j to A6j via the power source wiring PW (1). At this time, voltages of the gate wirings G1 (1) to G6 (1) sequentially become high at every it period in a corresponding manner as shown in FIG. 3, and voltages of the control wirings E1 (1) to E6 (1) sequentially become low at every it period in a corresponding manner as shown in FIG. 3. When a voltage of each gate wiring Gi (1) is high, a voltage of each control wiring Ei (1) is low. When a voltage of each gate wiring Gi (1) is low, a voltage of each control wiring Ei (1) is high.

In this manner, a period in which a voltage of the control wiring Ei (1) is low under such condition that a voltage of the gate wiring Gi (1) of each pixel circuit Aij (1) is high at 20 t to 27 t in the third field period is a period for performing the first operation in which the current source circuit 2 is connected to the power source wiring PW (1) so as to set a value of a current allowed to flow to the organic EL element EL1 of each pixel.

Further, a voltage of the control wiring Tim is low during a period of 28 t to 34 t in the third field period, so that the power source wiring PW (1) of FIG. 2 is connected to the voltage source circuit 6. At this time, voltages of the control wirings Ei (1) at all once become low under such condition that a voltage of the gate wiring Gi (1) of each pixel circuit Aij (1) remains low, so that the voltage source circuit 6 allows a current whose value has been set by the TFT element Q1 to flow to the organic EL element EL1. Further, at this time, a current whose value has been set is allowed to flow to the organic EL element EL1 of each pixel regardless of a driving condition of the organic EL element EL1 of other pixel, that is, regardless of whether or not to allow the current to flow.

In this manner, a period of 28 t to 34 t in the third field period is a period for performing the second operation in which the voltage source circuit 6 is connected to the power source wiring PW (1) so as to allow a current, whose value has been set by performing the first operation, to flow to the organic EL element EL1 of each pixel.

Note that, in the aforementioned driving method, a ratio of periods in which voltages of the control wirings Ei (1) of each pixel circuit Aij (1) are made low at all once, that is, a ratio of periods in which the second operation is performed is 1:3:7. However, the organic EL element EL1 of each pixel circuit Aij (1) has been used to display an image only for a period of 1 t so as to set the gate-source voltage of the TFT element Q1 in performing the first operation, so that a ratio of substantial display periods is 2:4:8 corresponding to 1:2:4 which is a ratio obtained in terms of weights of the bits.

Figure 14:
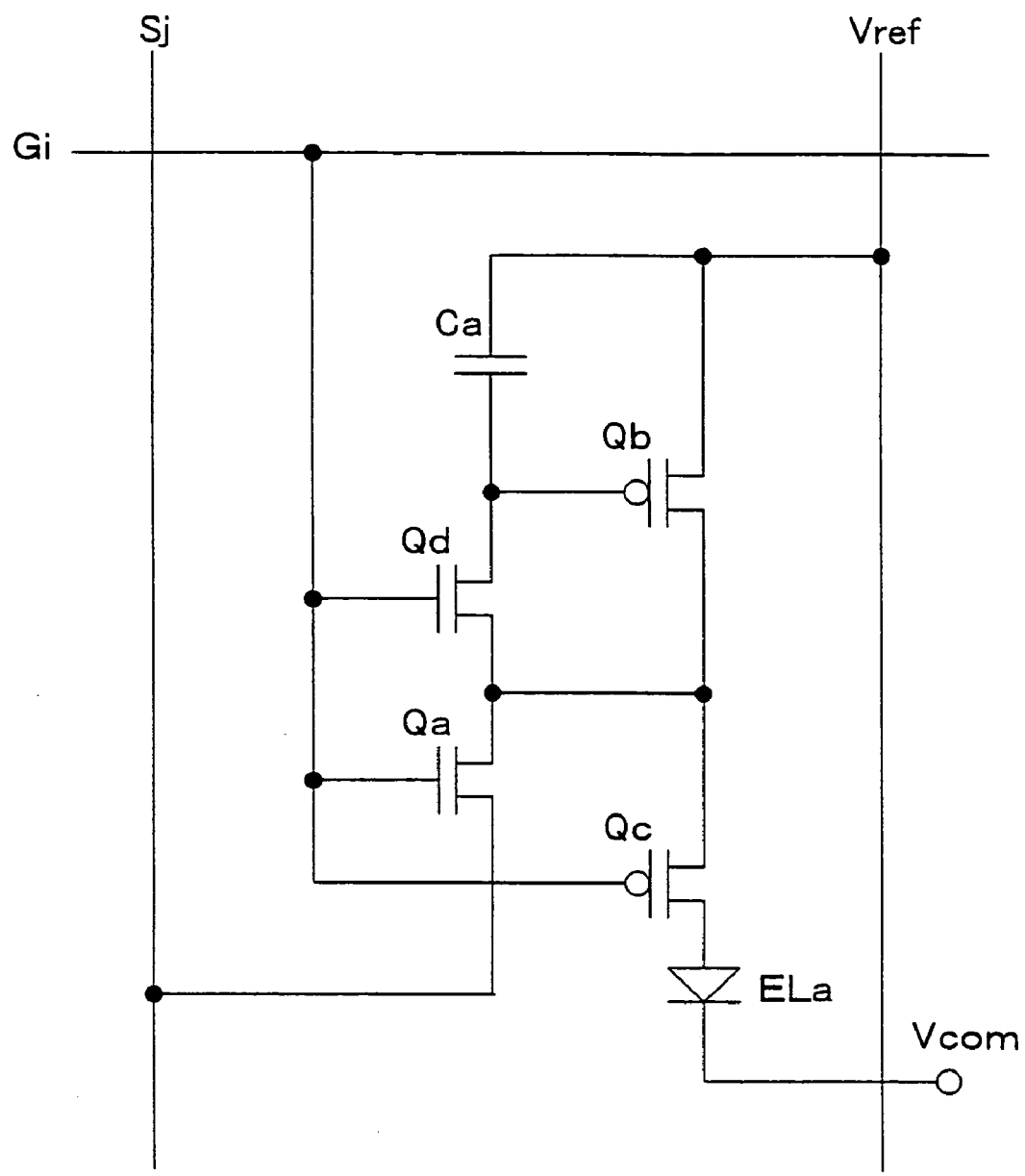
FIG. 14 is a circuit diagram showing an arrangement of Example 2 of a pixel circuit provided on a conventional display device.
Figure 15:
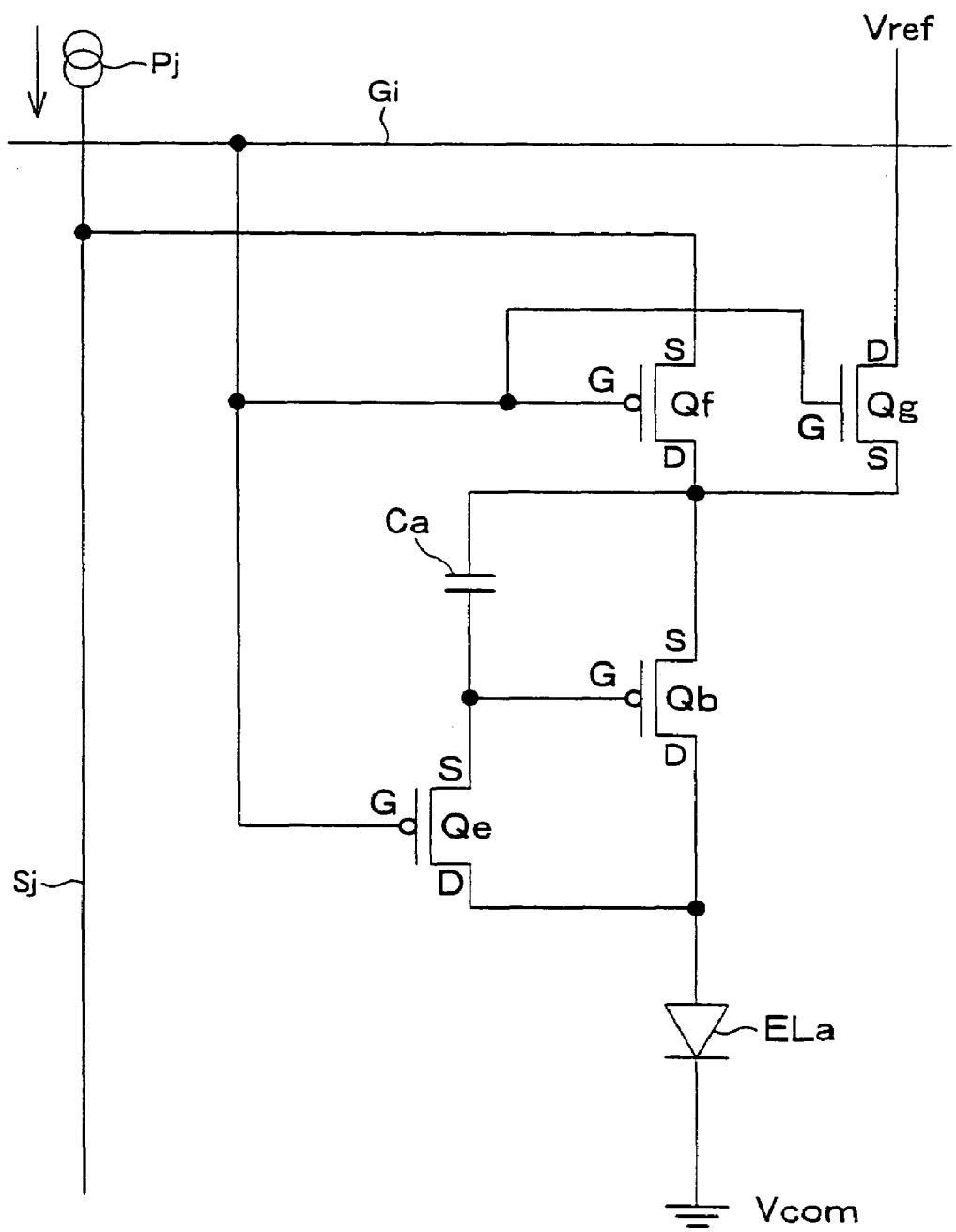
FIG. 15 is a circuit diagram showing an arrangement of Example 3 of a pixel circuit provided on a conventional display device.

In the pixel circuit Aij (1) according to the present embodiment, as shown in FIG. 1, a single pixel (=a single dot) includes not only an organic EL element EL1 but also a power source wiring PW (1), a gate wiring Gi (1) and a control wiring Ei (1) (that is, two gate wirings), three TFT elements, and a capacitor C1. Thus, variation of the TFT property is compensated by a current, having a uniformed value, which is supplied from the power source wiring PW, thereby allowing a current, whose value has been set, to flow to the organic EL element EL1. Further, this arrangement is different from the conventional 4-TFT pixel circuit arrangement of FIG. 14 or FIG. 15 in that one TFT element is omitted, so that it is possible to enlarge an ITO area. Thus, it is not necessary that luminance of the organic EL element EL1 is so high in obtaining the same display luminance, so that it is possible to reduce the luminance of the organic EL element EL1, thereby making the life of the organic EL element EL1 longer.

Figure 4:
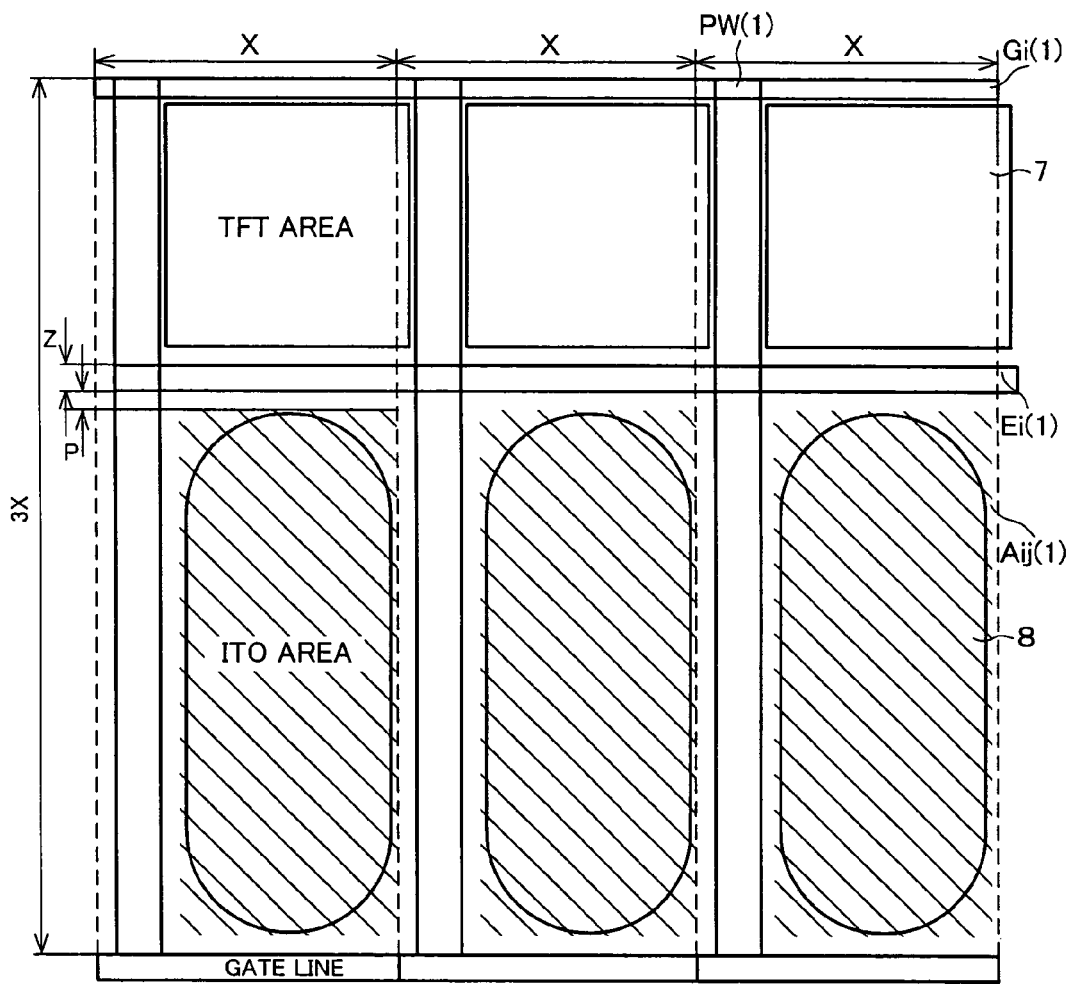
FIG. 4 is a plan view showing a layout of a pixel having the pixel circuit of FIG. 1.
Figure 16:
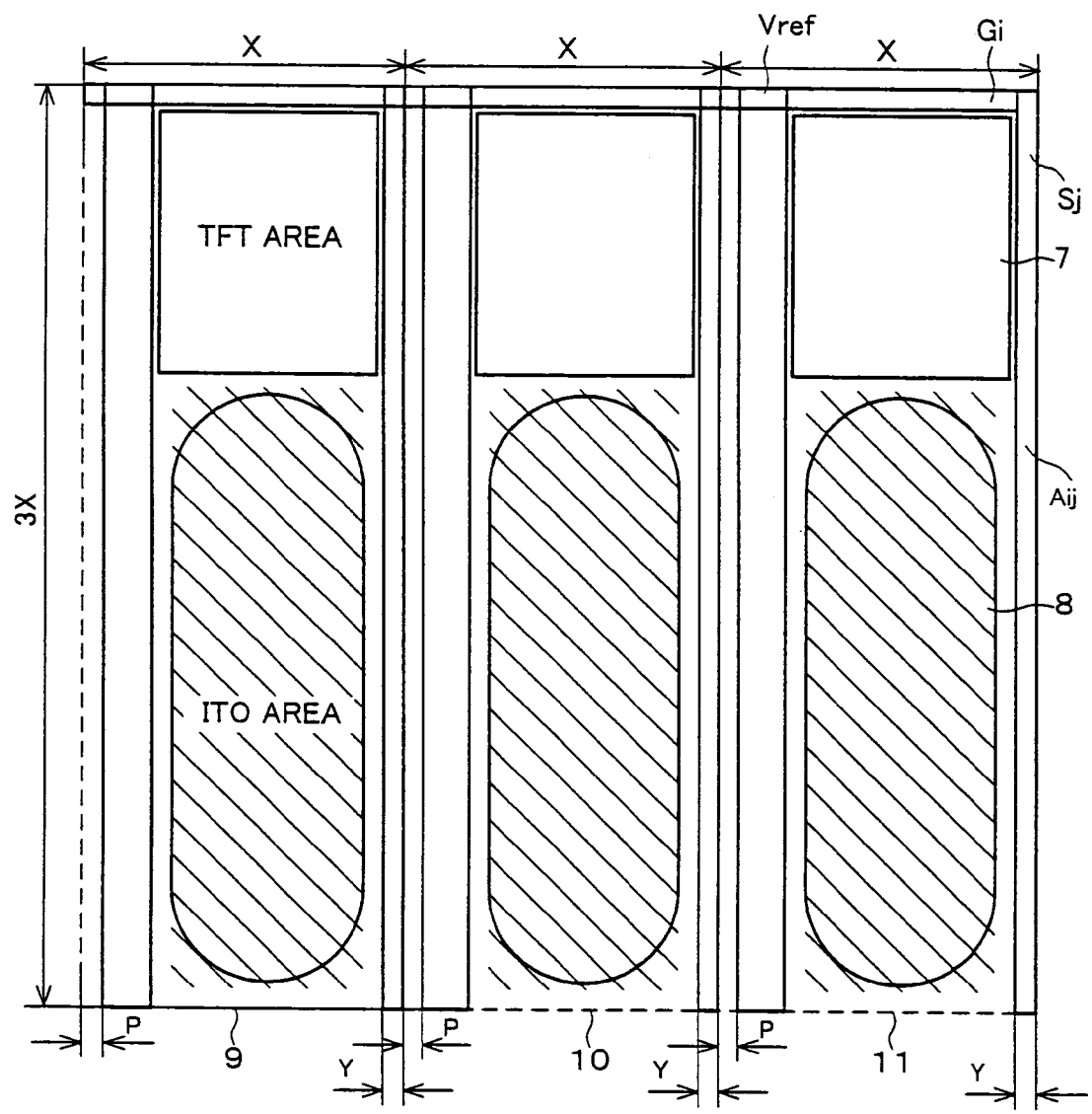
FIG. 16 is a plan view showing an example of a layout of a pixel having the pixel circuit of FIG. 14 or FIG. 15.

Further, the control wiring Ei (1) which is a gate wiring additionally provided to the conventional arrangement crosses the dots of RGB as well as the gate wiring Gi (1) as shown in FIG. 4. Thus, in FIGS. 14 and 15 each of which shows a back ground art, there are formed not only the TFT area 7 and the area of the gate wiring Gi but also a pixel area (each dot of RGB constitutes a single pixel) which cannot be used to emit light due to the source wiring Sj, and the pixel area is such that: pixel length×(source wiring width Y [μm]+process blank P [μm])×3 as shown in FIG. 16. On the other hand, in the arrangement of the pixel circuit Aij (1) according to the present embodiment, the power source wiring PW (1) functions as both a power source wiring and a source wiring, so that the source wiring provided in the conventional pixel circuit is not required. Thus, as shown in FIG. 4, it is possible to make the following arrangement: pixel width×(gate wiring width Z [μm]+process blank P [μm]). In most of the pixels, pixel width pixel length (=RGB's each dot length=RGB's each dot width×[μm]×3), so that the display device of the present embodiment enables the ITO area 8 (i.e., an organic EL area) to be larger by the foregoing difference. Thus, this arrangement enables the organic EL element to have less luminance required in obtaining the same display luminance, so that it is possible to make the life of the organic EL element EL1 longer.

Further, as a result, it is possible to enlarge the dot width of whole the RGB dots. In a process of providing droplets of RGB colors on banks formed by performing an inkjet process, the foregoing arrangement causes a target hole to be substantially in a circle shape, so that the arrangement is preferable.

As described above, according to the display device of the present embodiment, the display device includes a pixel circuit arrangement which allows a current whose value has been set to flow to the organic EL element EL1, and it is possible to enlarge an area of the transparent electrode, so that an effect of enlarging the area of the transparent electrode is great particularly in an arrangement in which light is emitted from the side of a substrate where the switching element is disposed, that is, in a pixel circuit of a bottom emission arrangement.

Further, in the present embodiment, the power source wiring PW (1) functions as both a power source wiring and a source wiring that are required in each circuit of a conventional pixel, so that it is possible to reduce the number of wirings. As a result, this arrangement is useful in enlarging the area of the transparent electrode. Thus, it is possible to provide a display device which includes a pixel circuit arrangement allowing a current whose value has been set to flow to the organic EL element EL1 and enables the area of the transparent electrode to be enlarged. Particularly in a bottom emission structure, this arrangement is expected to enlarge the area of the transparent electrode.

Further, the luminance of the organic EL element varies depending on the strength of the current flowing therein. Thus, when a current from a single output is divided into 256 levels for example, it is possible to display an image having 256 tones. Therefore, in a simple view, it is possible to use a current whose value is the same as the number of tones so as to display an image of tones that have been set. However, actually, a minute current is treated, the current value that can be achieved is sometimes less than the number of tones in terms of a technical problems particularly in a case where a power source circuit is constituted of a TFT element. Further, at least in a case of preparing two states: a state in which a light emitting element emits light and a state in which the light emitting element does not emit light, the current is required to have two or more values including zero. In order to obtain a predetermined number of tones under such condition, the following time dividing process is performed for example: a light emitting operation is repeatedly performed plural times within a predetermined period so as to compensate shortage of the current value, and the number of times the light emitting operation is performed is multiplied by a light emitting time so as to provide the tones with weights corresponding to the number of bits, thereby displaying an image having the tones. Thus, the current source circuit 2 is set to output at least two current values so as to express the tones. In the present embodiment, at least the state in which light is emitted and the state in which light is not emitted are prepared, so that the current source circuit 2 is set to output two or more values including zero. The number of times light is emitted and the current values are set, so that it is possible to obtain such advantage that the arrangement makes it easy to design a circuit and set a driving condition of the element.

In terms of this arrangement, the aforementioned example shows a case of performing multiple tone display. That is, as in the case where the first to third field periods are prepared in FIG. 3, the first operation and the second operation that is performed after the first operation are performed plural times at a predetermined period (one frame period). This operation is substantially the same as an operation in which current setting+light emission are performed plural times (three times in the foregoing example) within one frame period. By combining periods of 1:2:4 with each other, it is possible to change a total length of time in which the currents are allowed to flow to the organic EL element EL1 in one frame period. According to the total length, it is possible to realize display whose number of tones is larger than the current values of the current source circuit 2. For example, it is possible to realize display of 8 tones in accordance with the periods of 1:2:4.

Particularly, in a case where the current source circuit 2 connected to the power source wiring PW (1) is constituted of a TFT and the like, it is often that there is limit in the number of current values that can be outputted from the current source circuit 2, that is, it is often that the number of the output current values is limited to two or more integral numbers including zero, so that the aforementioned tone display is effective.

Note that, the present embodiment describes the organic EL display as an example of a display device, but it is possible to realize the display device of the present invention by using a display device such as an FED (Field Emission Display).

Embodiment 2

Figure 5:
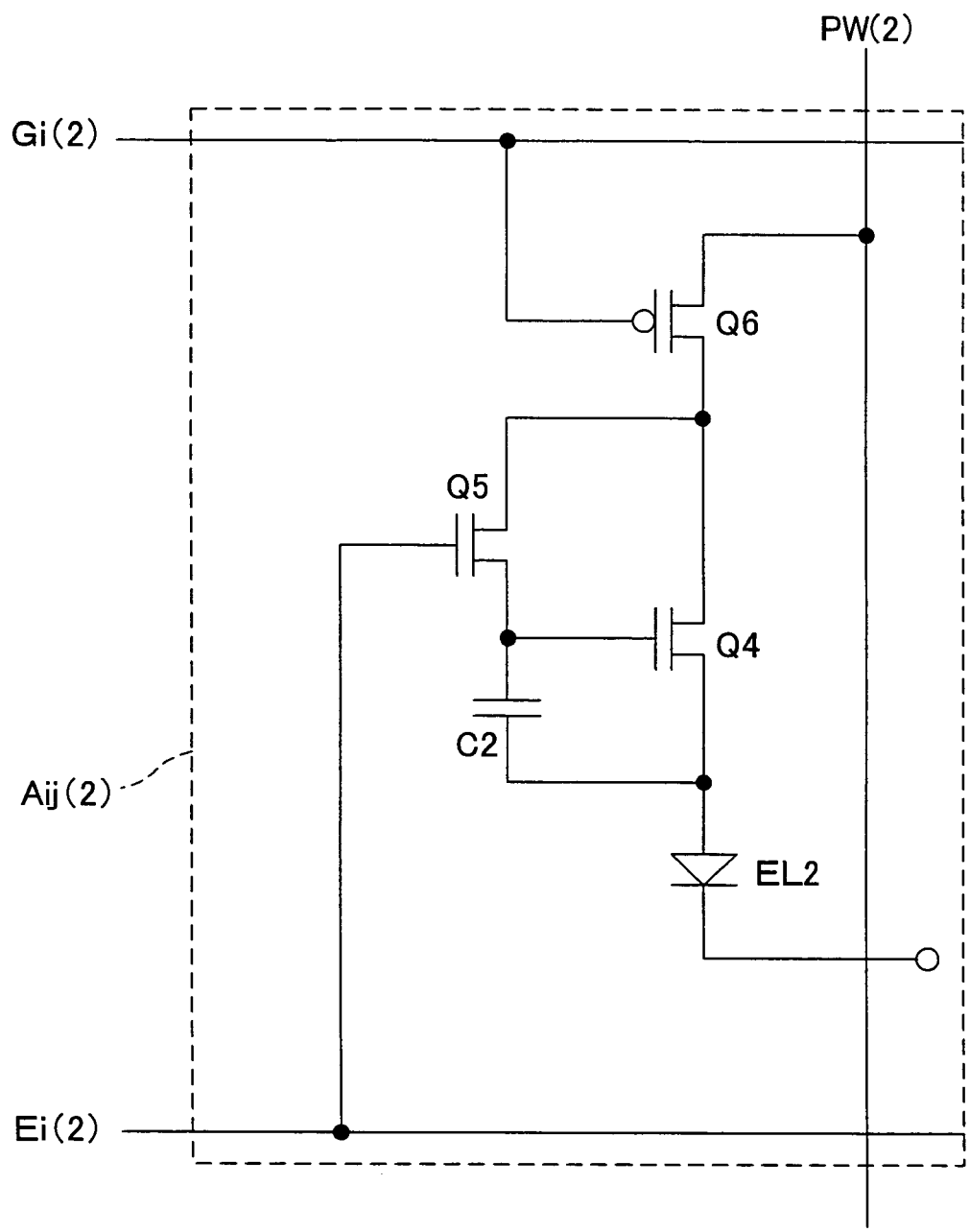
FIG. 5 is a circuit diagram showing an arrangement of a pixel circuit provided on a display device according to Embodiment 2 of the present invention.
Figure 6:
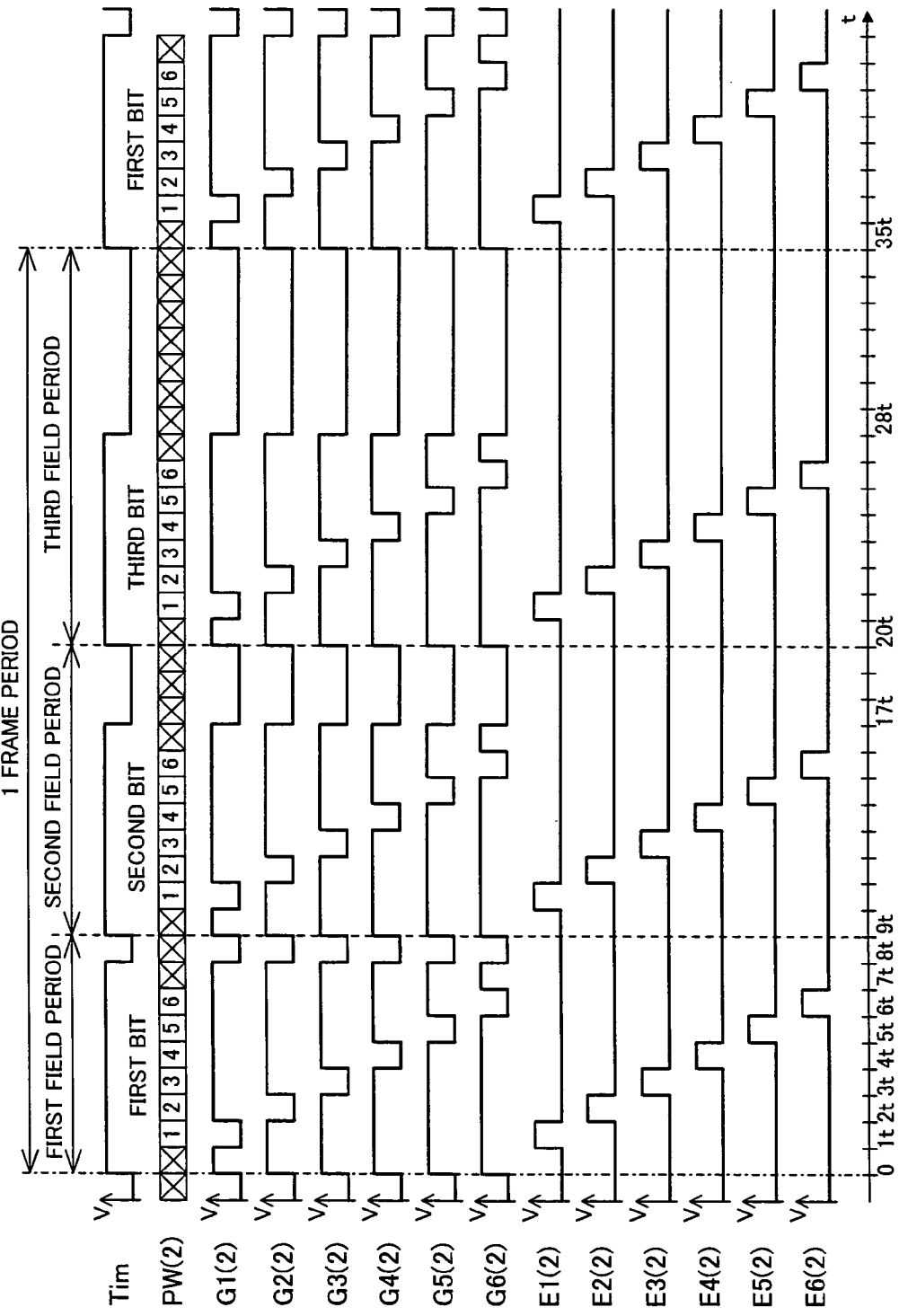
FIG. 6 is a timing chart showing operations of the display device according to Embodiment 2 of the present invention.

The following description will explain another embodiment of the present invention with reference to FIG. 5 and FIG. 6. Note that, the same reference signs are given to components having the same functions as the components described in Embodiment 1, and description thereof is omitted.

FIG. 5 shows a pixel circuit Aij (2) of a display device according to the present embodiment. The pixel circuit Aij (2) is a single pixel. If there are pixels of RGB, the pixel circuit Aij (2) shows a single combination of the pixels.

The pixel circuit Aij (2) includes a current-driving-type organic EL element EL2, n-type TFT elements Q4 and Q5, a p-type TFT element Q6, a capacitor C2, a gate wiring Gi (2), a power source wiring PW (2), and a control wiring Ei (2).

The TFT element (second active element) Q6 is connected to the power source wiring PW (2). A gate terminal of the TFT element Q6 is connected to the gate wiring (second wiring) Gi (2). Further, the TFT element (first active element, active element) Q4 and the organic EL element EL2 are connected to each other in series on the opposite side of a connection point of the TFT element Q6 and the power source wiring PW (2) so that the TFT element Q4 is positioned on the side of the TFT element Q6. The organic EL element EL2 is disposed so that its anode is positioned on the side of the TFT element Q4.

The capacitor (electric charge retaining means) C2 is disposed between a gate terminal and a source terminal of the TFT element Q4. The TFT element (third active element) Q5 is disposed between a drain terminal and the gate terminal of the TFT element Q4. A gate terminal of the TFT element Q5 is connected to the control wiring (third wiring) Ei (2).

The display device according to the present embodiment is arranged so that: in each pixel, a value of a current flowing to the organic EL element EL2 is set by using the foregoing elements and wirings, so as to drive the organic EL element EL2 on the basis of the current having the foregoing value. The power source wiring PW (2) is a wiring for allowing a current to flow to the organic EL element EL2. Thus, as apparent from the foregoing description, the TFT element Q4 is provided in series to the organic EL element EL2 so as to be positioned in a path for allowing the current to flow from the power source wiring PW (2) to the organic EL element EL2, and its gate terminal functions as a control terminal which controls the conductance. The higher a voltage applied to the gate terminal is, the smaller the conductance is. The lower a voltage applied to the gate terminal is, the larger the conductance is. Further, the TFT element Q6 is a switching element provided in series to the organic EL element EL2 and the TFT element Q4 so as to be positioned in the aforementioned path, and its gate terminal functions as a control terminal for allowing/stopping the conduction. When a low voltage is applied to the gate terminal, the TFT element Q6 conducts. When a high voltage is applied to the gate terminal, the TFT element Q6 does not conduct.

Further, the capacitor C2 applies a voltage corresponding to the stored electric charge to a line between the gate and the source of the TFT element Q4 as a control voltage for controlling the conductance of the TFT element Q4. The TFT element Q5 is a switching element provided in a path for supplying the electric charge to the capacitor C2, and its gate terminal functions as a control terminal for allowing/stopping the conduction. When a high voltage is applied to the gate terminal, the TFT element Q5 conducts. When a low voltage is applied to the gate terminal, the TFT element Q5 does not conduct. While the TFT element Q5 conducts, the electric charge can be supplied to the capacitor C2, and while the TFT element Q5 does not conduct, the capacitor C2 retains the stored electric charge.

Further, the control wiring Ei (2) and the gate wiring Gi (2) cross the power source wiring PW (2) at right angle in each pixel, and the control wiring Ei (2) applies a voltage determining a switching condition of the TFT element Q5 (control voltage which allows/stops the conduction) to the gate terminal of the TFT element Q5, and the gate wiring Gi (2) applies a voltage determining a switching condition of the TFT element Q6 (control voltage which allows/stops the conduction) to the gate terminal of the TFT element Q6.

Also the pixel circuit Aij (2) arranged in the foregoing manner constitutes a matrix of m×n as in the arrangement described in FIG. 2 of Embodiment 1 so as to realize the display device. Operations of the display device having such arrangement are described as follows with reference to FIG. 6. FIG. 6 corresponds to FIG. 3 of Embodiment 1.

One frame period, first to third field periods, and periods for performing the first and second operations are set in the same manner as in the case shown in FIG. 3. The operations of Embodiment 2 is different from the operations of Embodiment 1 in that: a voltage condition of the gate wiring Gi (1) and a voltage condition of the control wiring Ei (1) are interchanged with a voltage condition of the gate wiring Gi (2) and a voltage condition of the control wiring Ei (2). Although the voltage conditions are interchanged, the TFT element Q4, the TFT element Q5, the TFT element Q6, and the capacitor C2 operate in the same manner as the TFT element Q1, the TFT element Q2, the TFT element Q3, and the capacitor C1 of FIG. 1 in this order.

In the pixel circuit Aij (2) according to the present embodiment, a single pixel (=a single dot) includes not only the organic EL element EL2 (ITO electrode which functions as an anode electrode) but also a power source wiring PW (2), a gate wiring Gi (2) and a control wiring Ei (2) (that is, two gate wirings), three TFT elements, and a capacitor C2. Thus, as in Embodiment 1, it is possible to enlarge the area of the transparent electrode. Further, it is obvious that other effects can be obtained as in Embodiment 1.

Embodiment 3

Figure 7:
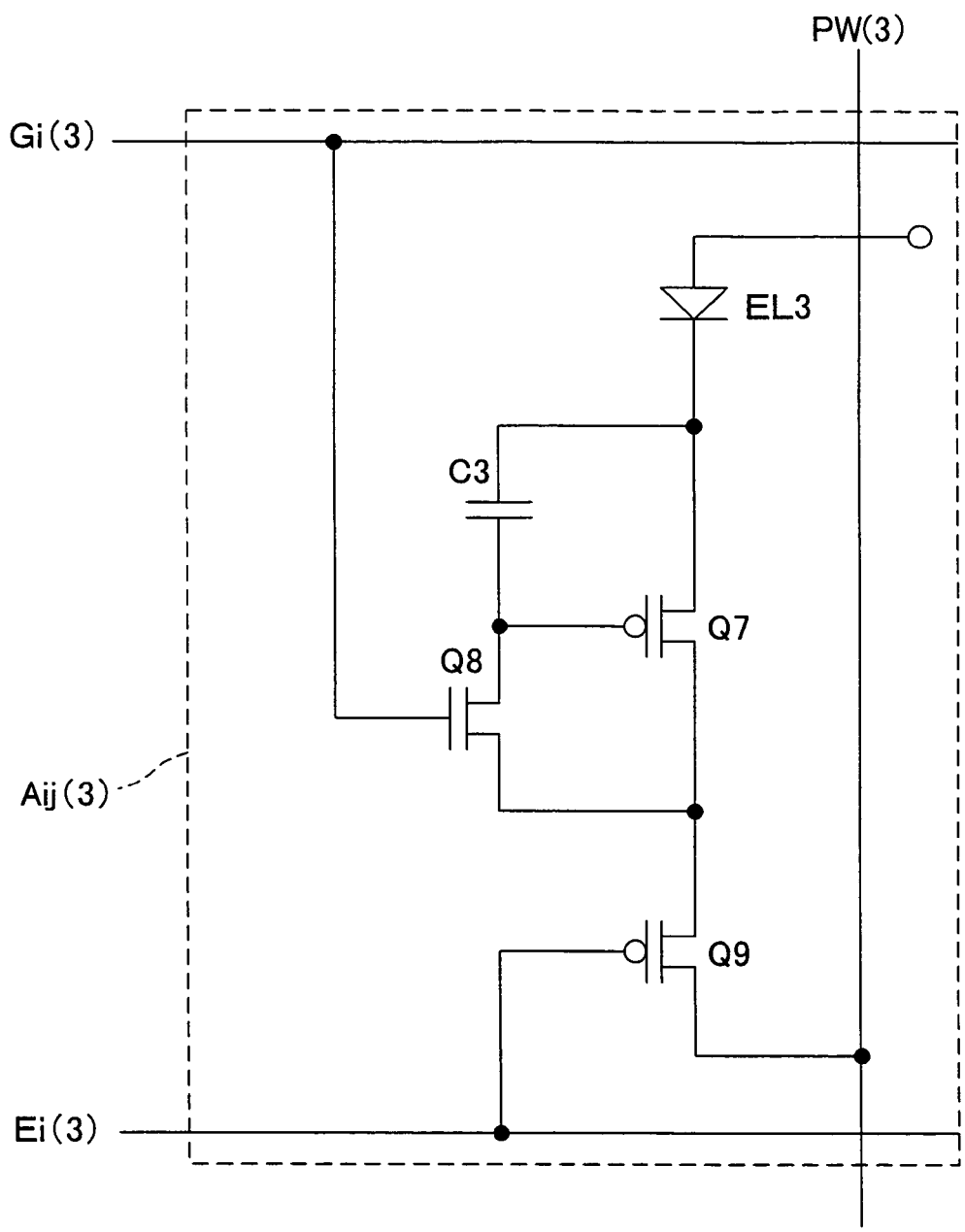
FIG. 7 is a circuit diagram showing an arrangement of a pixel circuit provided on a display device according to Embodiment 3 of the present invention.
Figure 8:
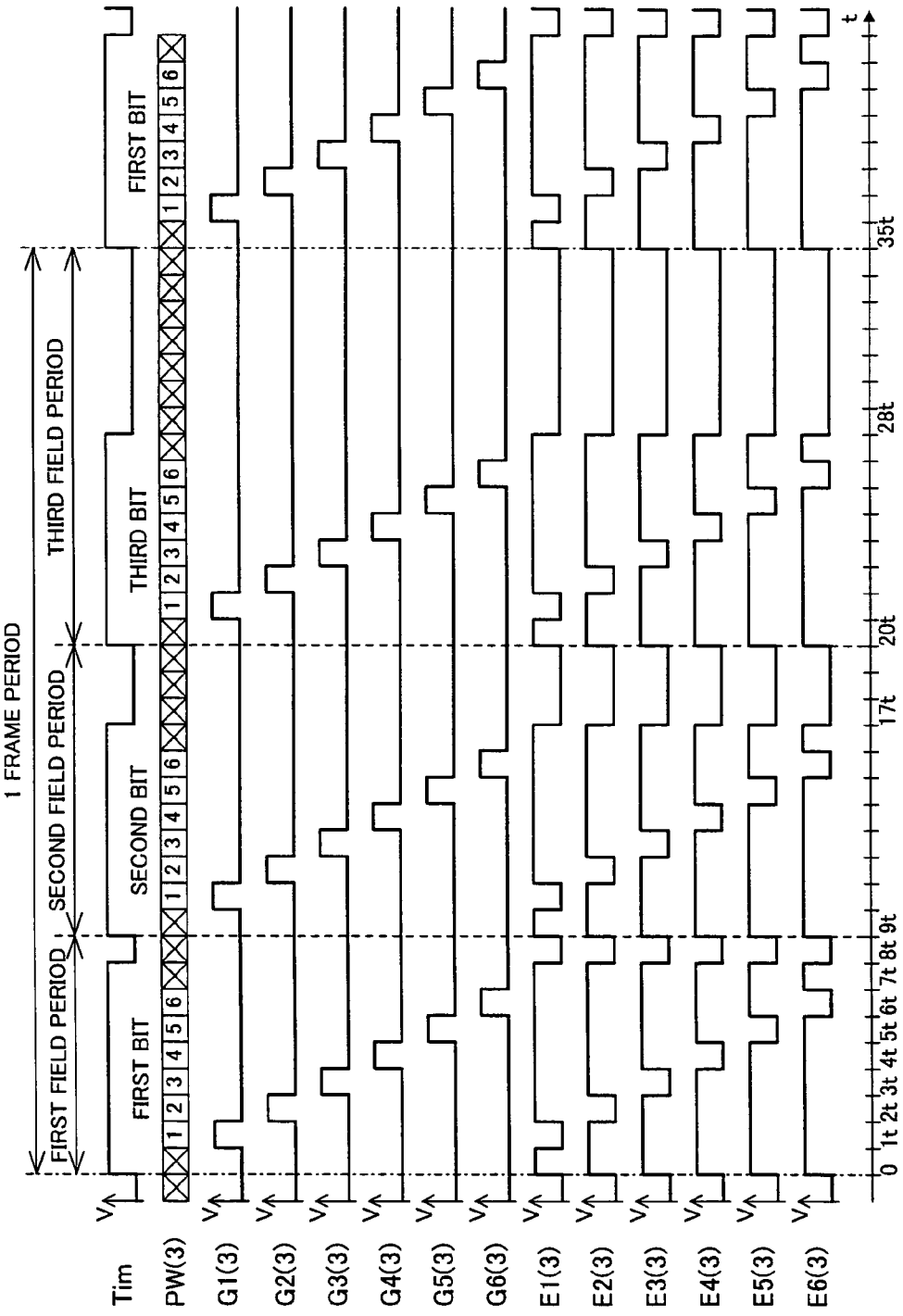
FIG. 8 is a timing chart showing operations of the display device according to Embodiment 3 of the present invention.

The following description will explain still another embodiment of the present invention with reference to FIG. 7 and FIG. 8. Note that, the same reference signs are given to components having the same functions as the components of the arrangements described in Embodiments 1 and 2, and description thereof is omitted.

FIG. 7 shows a pixel circuit Aij (3) of a display device according to the present embodiment. The pixel circuit Aij (3) is a single pixel, and if there are RGB pixels, the pixel circuit Aij (3) shows a single combination of the RGB pixels.

The pixel circuit Aij (3) includes: a current-driving-type organic EL element EL3; p-type TFT elements Q7 and Q9; an n-type TFT element Q8; a capacitor C3; a gate wiring Gi (3); a power source wiring PW (3); and a control wiring Ei (3).

The TFT element (second active element) Q9 is connected to the power source wiring (first wiring, wiring) PW (3). A gate of the TFT element Q9 is connected to the control wiring (second wiring) Ei (3). Further, the TFT element (first active element, active element) Q7 and the organic EL element EL3 are connected to each other in series on the opposite side of a connection point of the TFT element Q9 and the power source wiring PW (3) so that the TFT element Q7 is positioned on the side of the TFT element Q9. A cathode of the organic EL element EL3 is positioned on the side of the TFT element Q7.

The capacitor (electric charge retaining means) C3 is disposed between a gate terminal and a source terminal of the TFT element Q7. The TFT element (third active element) Q8 is disposed between a drain terminal and the gate terminal of the TFT element Q7. A gate terminal of the TFT element Q8 is connected to the gate wiring (third wiring) Gi (3).

The display device according to the present embodiment is arranged so that: in each pixel, a value of a current flowing to the organic EL element EL3 is set by using the foregoing elements and wirings, so as to drive the organic EL element EL3 on the basis of the current having the foregoing value. The power source wiring PW (3) is a wiring for allowing a current to flow to the organic EL element EL3. Note that, a direction in which a current flows in the power source wiring PW (3) is opposite to a direction in which a current flows in the power source wiring PW (1) of Embodiment 1 and a direction in which a current flows in the power source wiring PW (2) of Embodiment 2. Thus, as apparent from the foregoing description, the TFT element Q7 is provided in series to the organic EL element EL3 so as to be positioned in a path for allowing the current to flow from the power source wiring PW (3) to the organic EL element EL3, and its gate terminal functions as a control terminal which controls the conductance. The lower a voltage applied to the gate terminal is, the smaller the conductance is. The higher a voltage applied to the gate terminal is, the larger the conductance is. Further, the TFT element Q9 is a switching element provided in series to the organic EL element EL3 and the TFT element Q7 so as to be positioned in the aforementioned path, and its gate terminal functions as a control terminal which allows/stops the conduction. When a low voltage is applied to the gate terminal, the TFT element Q9 conducts. When a high voltage is applied to the gate terminal, the TFT element Q9 does not conduct.

Further, the capacitor C3 applies a voltage corresponding to the stored electric charge to a point between the gate and the source of the TFT element Q7 as a control voltage for controlling the conductance. The TFT element Q8 is a switching element provided in a path for supplying the electric charge to the capacitor C3, and its gate terminal is a control terminal which allows/stops the conduction. When a high voltage is applied to the gate terminal, the TFT element Q8 conducts. When a low voltage is applied to the gate terminal, the TFT element Q8 does not conduct. While the TFT element Q8 conducts, the electric charge can be supplied to the capacitor C3, and while the TFT element Q8 does not conduct, the capacitor C3 retains the stored electric charge.

Further, the control wiring Ei (3) and the gate wiring Gi (3) cross the power source wiring PW (3) at right angle in each pixel, and the control wiring Ei (3) applies a voltage determining a switching condition of the TFT element Q9 (control voltage which allows/stops the conduction) to the gate terminal of the TFT element Q9, and the gate wiring Gi (3) applies a voltage determining a switching condition of the TFT element Q8 (control voltage which allows/stops the conduction) to the gate terminal of the TFT element Q8.

Also the pixel circuit Aij (3) arranged in the foregoing manner constitutes a matrix of m×n as in the arrangement described in FIG. 2 of Embodiment 1 so as to realize the display device. Operations of the display device having such arrangement are described as follows with reference to FIG. 8. FIG. 8 corresponds to FIG. 3 of Embodiment 1.

One frame period, the first to third field period, and period for performing the first and second operations are set in the same manner as in Embodiment 1, and the relationship between the gate wiring Gi (3) and the control wiring Ei (3) in terms of a high/low voltage condition is the same as the relationship between the gate wiring Gi (1) and the control wiring Ei (1) in terms of a high/low voltage condition. However, when the power source wiring PW (3) is connected to the voltage source circuit 6, an output terminal potential of the voltage source circuit 6 is set to be lower than an anode-side potential of the organic EL element EL3. This arrangement is different from (i) an arrangement in which the output terminal potential of the voltage source circuit 6 is set to be higher than the anode-side potential of the organic EL element EL1 in Embodiment 1 and (ii) an arrangement in which the output terminal potential of the voltage source circuit 6 is set to be higher than the anode-side potential of the organic EL element EL2 in Embodiment 2. In this manner, the foregoing arrangement is different from the arrangements of Embodiments 1 and 2 in terms of the polarity of the voltage, but operations of the TFT element Q7, the TFT element Q8, the TFT element Q9, and the capacitor C3 are the same as the operations of the TFT element Q1, the TFT element Q2, the TFT element Q3, and the capacitor C1 of FIG. 3.

In the pixel circuit Aij (3) according to the present embodiment, a single pixel (=a single dot) includes not only an organic EL element EL3 (ITO electrode which functions as an anode electrode) but also a power source wiring PW (3), a gate wiring Gi (3) and a control wiring Ei (3) (that is, two gate wirings), three TFT elements, and a capacitor C3. Thus, as in Embodiment 1, it is possible to enlarge the area of the transparent electrode. Further, it is obvious that other effects can be obtained as in Embodiment 1.

Embodiment 4

Figure 9:
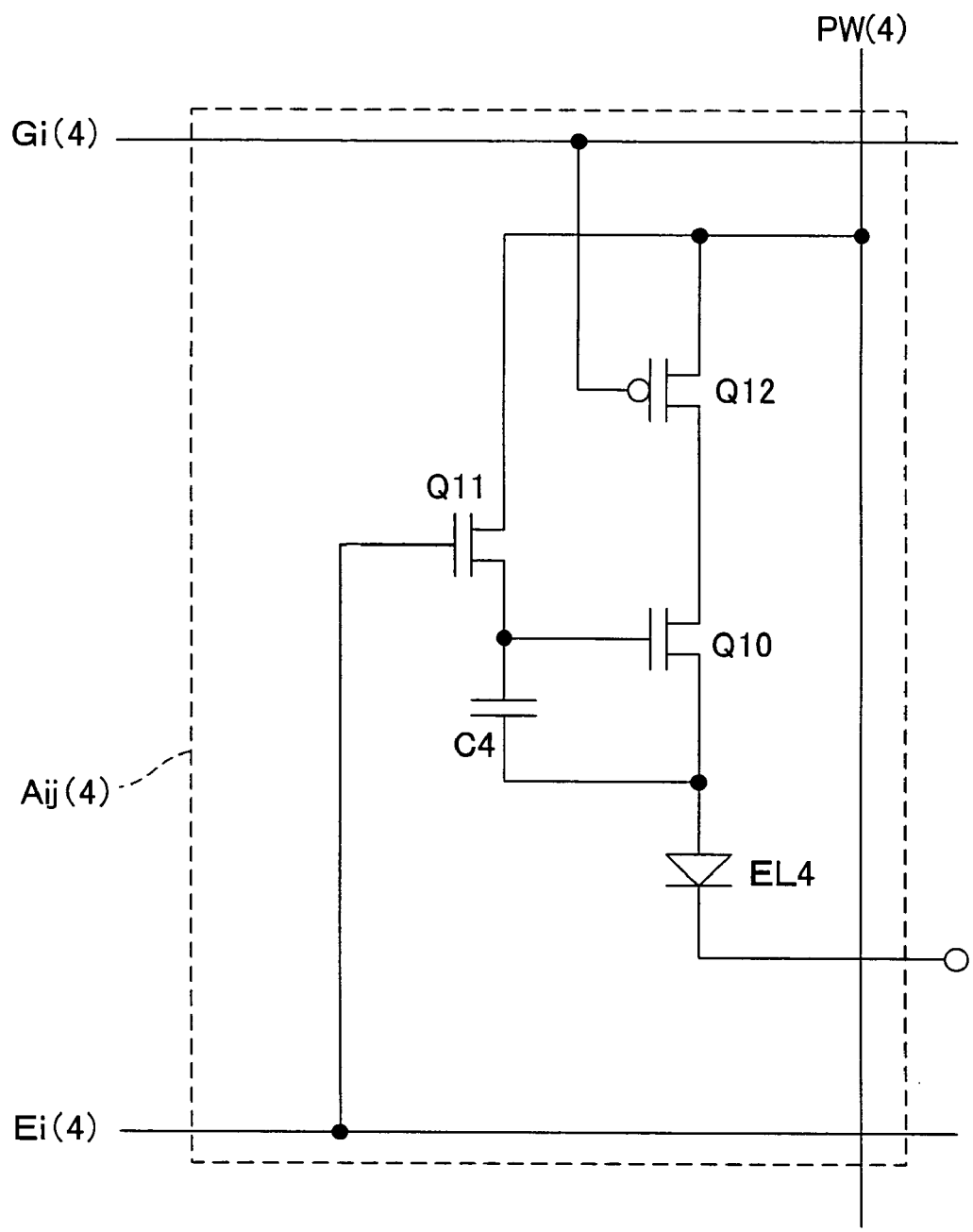
FIG. 9 is a circuit diagram showing an arrangement of a pixel circuit provided on a display device according to Embodiment 4 of the present invention.
Figure 10:
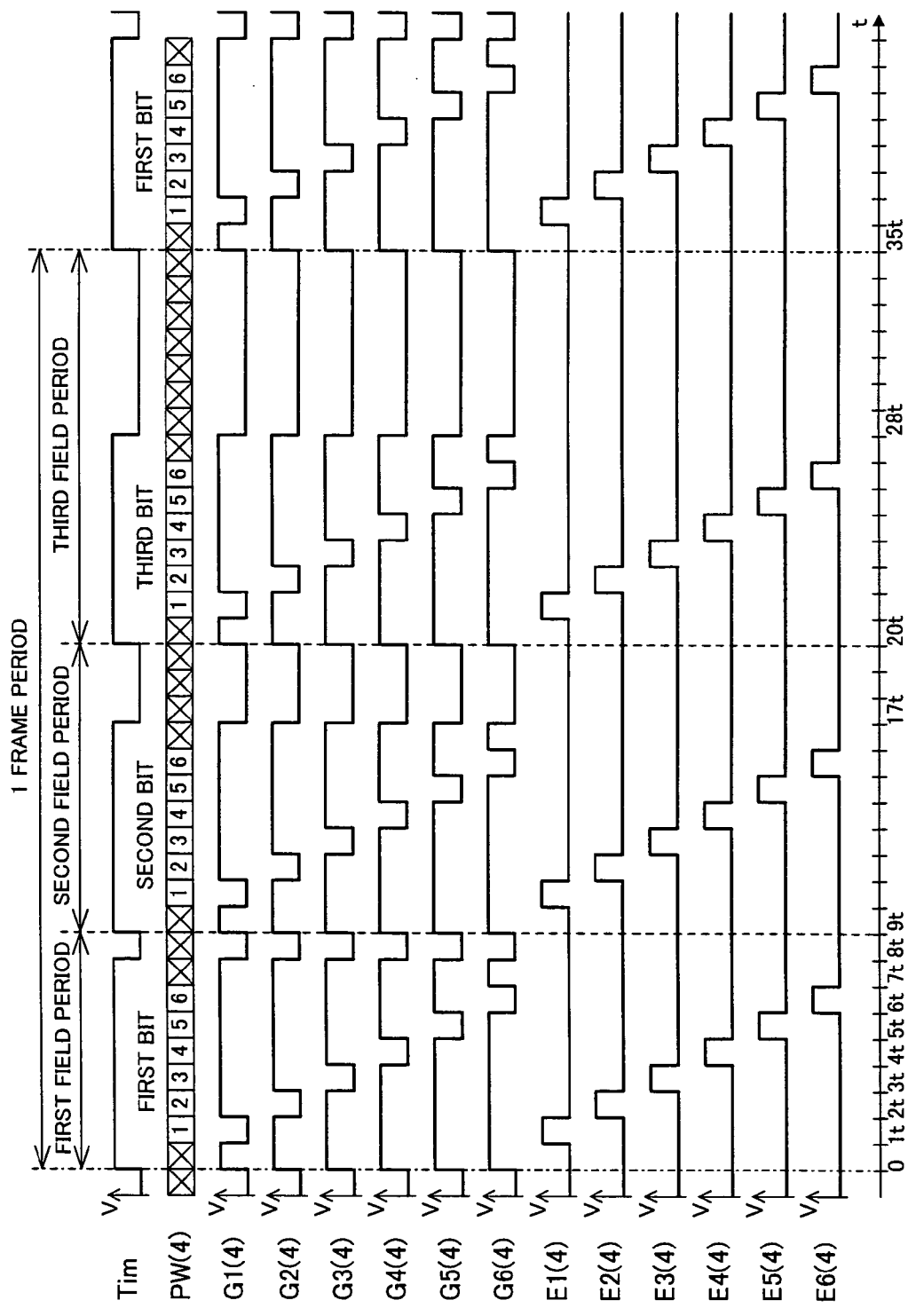
FIG. 10 is a timing chart showing operations of the display device according to Embodiment 4 of the present invention.

The following description will explain still another embodiment of the present invention with reference to FIG. 9 and FIG. 10. Note that, the same reference signs are given to components having the same functions as the components of the arrangements described in Embodiments 1 to 3, and description thereof is omitted.

FIG. 9 shows a pixel circuit Aij (4) of a display device according to the present embodiment. The pixel circuit Aij (4) is a single pixel, and if there are RGB pixels, the pixel circuit Aij (4) shows a single combination of the RGB pixels.

The pixel circuit Aij (4) includes: a current-driving-type organic EL element EL4; n-type TFT elements Q10 and Q1, a p-type TFT element Q12; a capacitor C4; a gate wiring Gi (4); a power source wiring PW (4); and a control wiring Ei (4).

The TFT element (second active element) Q12 is connected to the power source wiring (first wiring, wiring) PW (4). A gate of the TFT element Q12 is connected to the control wiring (second wiring) Ei (4). Further, the TFT element (first active element, active element) Q10 and the organic EL element EL4 are connected to each other in series on the opposite side of a connection point of the TFT element Q12 and the power source wiring PW (4) so that the TFT element Q10 is positioned on the side of the TFT element Q12. An anode of the organic EL element EL4 is positioned on the side of the TFT element Q10.

The capacitor (electric charge retaining means) C4 is disposed between a gate terminal and a source terminal of the TFT element Q10. The TFT element (third active element) Q11 is disposed between a gate terminal of the TFT element Q10 and the power source wiring PW (4). A gate terminal of the TFT element Q11 is connected to the control wiring (third wiring) Ei (4).

The display device according to the present embodiment is arranged so that: in each pixel, a value of a current flowing to the organic EL element EL4 is set by using the foregoing elements and wirings, so as to drive the organic EL element EL4 on the basis of the current having the foregoing value. The power source wiring PW (4) is a wiring for allowing a current to flow to the organic EL element EL4. Thus, as apparent from the foregoing description, the TFT element Q10 is provided in series to the organic EL element EL4 so as to be positioned in a path for allowing the current to flow from the power source wiring PW (4) to the organic EL element EL4, and its gate terminal functions a control terminal which controls the conductance. The higher a voltage applied to the gate terminal is, the smaller the conductance is. The lower a voltage applied to the gate terminal is, the larger the conductance is. Further, the TFT element Q12 is a switching element provided in series to the organic EL element EL4 and the TFT element Q10 so as to be positioned in the aforementioned path, and its gate terminal functions as a control terminal for allowing/stopping the conduction. When a low voltage is applied to the gate terminal, the TFT element Q12 conducts. When a high voltage is applied to the gate terminal, the TFT element Q12 does not conduct.

Further, the capacitor C4 applies a voltage corresponding to the stored electric charge to a point between the gate and the source of the TFT element Q10 as a control voltage for controlling the conductance. The TFT element Q11 is a switching element provided in a path for supplying the electric charge to the capacitor C4, and its gate terminal functions as a control terminal which allows/stops the conduction. When a high voltage is applied to the gate terminal, the TFT element Q11 conducts. When a low voltage is applied to the gate terminal, the TFT element Q11 does not conduct. While the TFT element Q11 conducts, the electric charge can be supplied to the capacitor C4, and while the TFT element Q11 does not conduct, the capacitor C4 retains the stored electric charge.

Further, the control wiring Ei (4) and the gate wiring Gi (4) cross the power source wiring PW (4) at right angle in each pixel, and the control wiring Ei (4) applies a voltage determining a switching condition of the TFT element Q11 (control voltage which allows/stops the conduction) to the gate terminal of the TFT element Q11, and the gate wiring Gi (4) applies a voltage determining a switching condition of the TFT element Q12 (control voltage which allows/stops the conduction) to the gate terminal of the TFT element Q12.

Also the pixel circuit Aij (4) arranged in the foregoing manner constitutes a matrix of m×n as in the arrangement described in FIG. 2 of Embodiment 1 so as to realize the display device. Operations of the display device having such arrangement are described as follows with reference to FIG. 10. FIG. 10 corresponds to FIG. 3 of Embodiment 1.

One frame period, the first to third field period, and period for performing the first and second operations are set in the same manner as in the case shown in FIG. 3. This arrangement is different from the arrangement shown in FIG. 3 in that: a voltage condition of the gate wiring Gi (1) and a voltage condition of the control wiring Ei (1) are interchanged with a voltage condition of the gate wiring Gi (4) and a voltage condition of the control wiring Ei (4). Although the voltage conditions are interchanged, the TFT element Q10, the TFT element Q11, the TFT element Q12, and the capacitor C4 operate in the same manner as the TFT element Q1, the TFT element Q2, the TFT element Q3, and the capacitor C1 of FIG. 3 in this order.

In the pixel circuit Aij (4) according to the present embodiment, a single pixel (=a single dot) includes not only an organic EL element EL4 (ITO electrode which functions as an anode electrode) but also a power source wiring PW (4), a gate wiring Gi (4) and a control wiring Ei (4) (that is, two gate wirings), three TFT elements, and a capacitor C4. Thus, as in Embodiment 1, it is possible to enlarge the area of the transparent electrode. Further, it is obvious that other effects can be obtained as in Embodiment 1.

Embodiment 5

Figure 11:
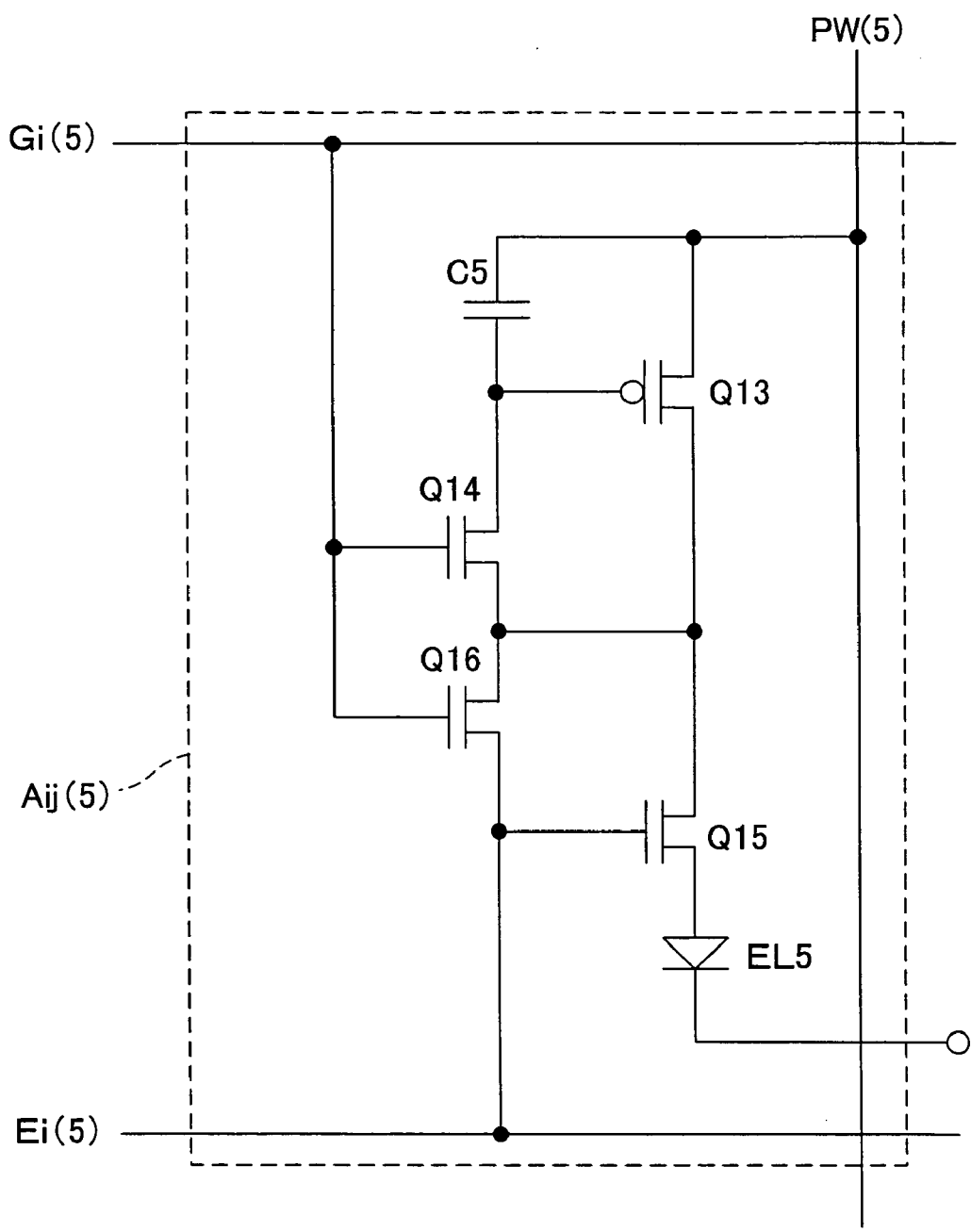
FIG. 11 is a circuit diagram showing an arrangement of a pixel circuit provided on a display device according to Embodiment 5 of the present invention.
Figure 12:
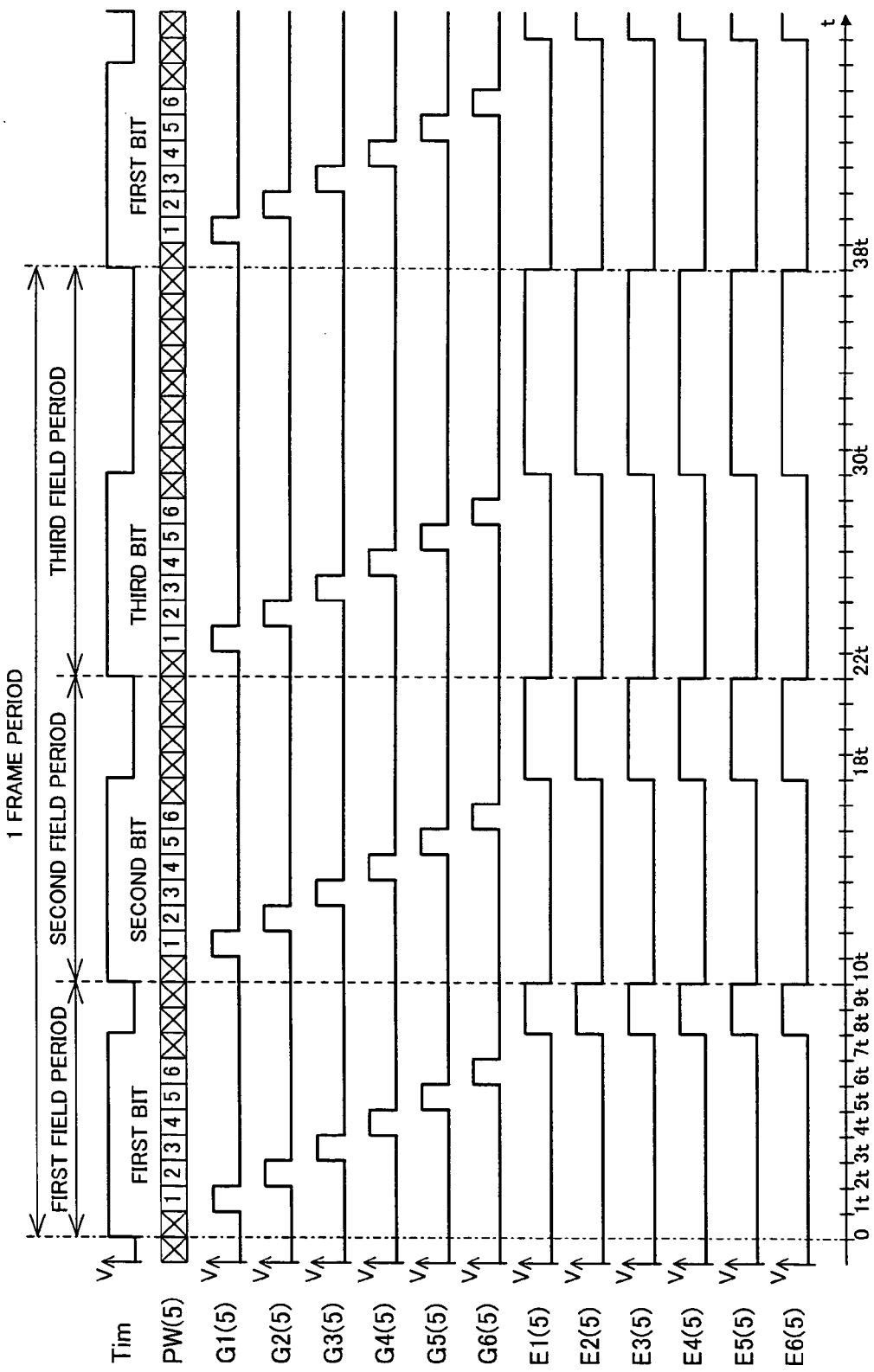
FIG. 12 is a timing chart showing operations of the display device according to Embodiment 5 of the present invention.
Figure 13:
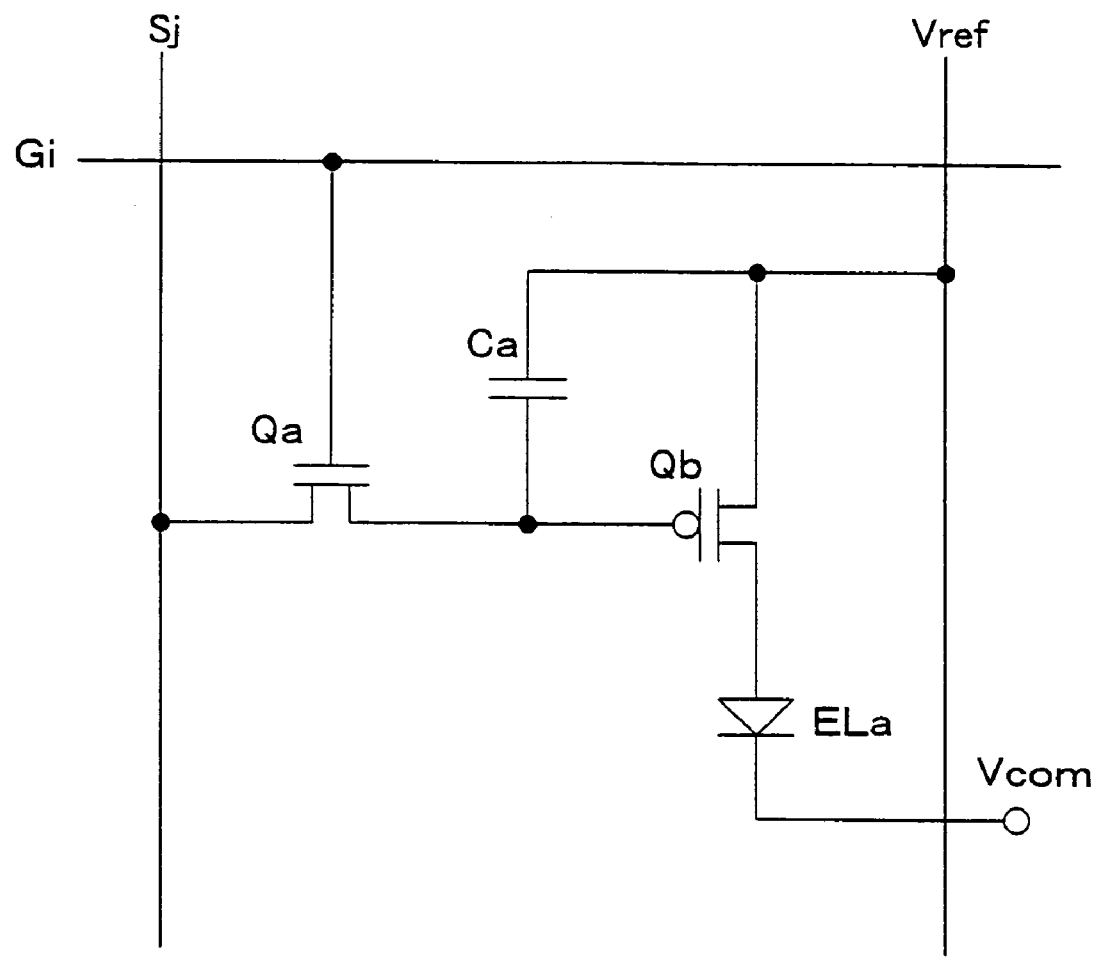
FIG. 13 is a circuit diagram showing an arrangement of Example 1 of a pixel circuit provided on a conventional display device.

The following description will explain still another embodiment of the present invention with reference to FIG. 11 and FIG. 12. Note that, the same reference signs are given to components having the same functions as the components of the arrangements described in Embodiments 1 to 4, and description thereof is omitted.

FIG. 11 shows a pixel circuit Aij (5) of a display device according to the present embodiment. The pixel circuit Aij (5) is a single pixel, and if there are RGB pixels, the pixel circuit Aij (5) shows a single combination of the RGB pixels.

The pixel circuit Aij (5) includes: a current-driving-type organic EL element EL5; a p-type TFT element Q13, n-type TFT elements Q14, Q15, and Q16; a capacitor C5; a gate wiring Gi (5); a power source wiring PW (5); and a control wiring Ei (5).

The TFT element (first active element, active element) Q13 and the capacitor (electric charge retaining means) C5 are connected to the power source wiring (first wiring, wiring) PW (5). The capacitor C5 is disposed between a gate terminal and a source terminal of the TFT element Q13. The TFT element (second active element) Q15 and the organic EL element (electro-optic element) EL5 are connected to each other in series to the TFT element Q13 so that the TFT element Q15 is positioned on the side of the TFT element Q13. A gate terminal of the TFT element Q15 is connected to the control wiring (second wiring) Ei (5). The organic EL element EL5 is disposed so that its anode is positioned on the side of the TFT element Q15.

Further, the TFT element (third active element) Q14 is disposed between (i) the gate terminal of the TFT element Q13 and (ii) a connection point of the TFT element Q13 and the TFT element QI5. A gate terminal of the TFT element Q14 is connected to the gate wiring (third wiring) Gi (5). Further, the TFT element (fourth active element) Q16 is disposed between (i) the connection point of the TFT element Q13 and the TFT element Q15 and (ii) the control wiring Ei (5). A gate terminal of the TFT element Q16 is connected to the gate wiring Gi (5).

The display device according to the present embodiment is arranged so that: in each pixel, a value of a current flowing to the organic EL element EL5 is set by using the foregoing elements and wirings, so as to drive the organic EL element EL5 on the basis of the current having the foregoing value. The power source wiring PW (5) is a wiring for allowing a current to flow to the organic EL element EL5. When the current is allowed to flow to the organic EL element EL5, the TFT element Q15 conducts as described later, so that the TFT element Q16 does not conduct. Thus, as apparent from the foregoing description, the TFT element Q13 is provided in series to the organic EL element EL5 so as to be positioned in a path for allowing the current to flow from the power source wiring PW (5) to the organic EL element EL5, and its gate terminal functions as a control terminal which controls the conductance. The lower a voltage applied to the gate terminal is, the smaller the conductance is. The higher a voltage applied to the gate terminal is, the larger the conductance is. Further, the TFT element Q15 is a switching element provided in series to the organic EL element EL5 and the TFT element Q13 so as to be positioned in the aforementioned path, and its gate terminal functions as a control terminal which allows/stops the conduction. When a low voltage is applied to the gate terminal, the TFT element Q15 conducts. When a high voltage is applied to the gate terminal, the TFT element Q15 does not conduct.

Further, the capacitor C5 applies a voltage corresponding to the stored electric charge to the gate terminal of the TFT element Q13 as a control voltage for controlling resistance of the TFT element Q13 in the conduction. The TFT element Q14 is a switching element provided in a path for supplying the electric charge to the capacitor C5, and its gate terminal functions as a control terminal which allows/stops the conduction. When a high voltage is applied to the gate terminal, the TFT element Q14 conducts. When a low voltage is applied to the gate terminal, the TFT element Q14 does not conduct. While the TFT element Q14 conducts, the electric charge can be supplied to the capacitor C5, and while the TFT element Q14 does not conduct, the capacitor C5 retains the stored electric charge. The TFT element Q16 functions as a gate terminal which allows/stops the conduction. When a high voltage is applied to the gate terminal, the TFT element Q16 conducts. When a low voltage is applied to the gate terminal, the TFT element Q16 does not conduct.

Further, the control wiring Ei (5) and the gate wiring Gi (5) cross the power source wiring PW (5) at right angle in each pixel, and the control wiring Ei (5) applies a voltage determining a switching condition of the TFT element Q15 (control voltage which allows/stops the conduction) to the gate terminal of the TFT element Q15, and the gate wiring Gi (5) applies a voltage determining switching conditions of the TFT elements Q14 and Q16 (control voltages each of which allows/stops the conduction) to the gate terminals of the TFT elements Q14 and Q16.

Also the pixel circuit Aij (5) arranged in the foregoing manner constitutes a matrix of m×n as in the arrangement described in FIG. 2 of Embodiment 1 so as to realize the display device.

Next, a driving method of the display device is described as follows with reference to FIG. 12. Note that, also FIG. 12 corresponds to FIG. 3 of Embodiment 1.

As shown in FIG. 12, one frame period of the display device is 38 t which ranges from 0 to 37 t. A first 10 t corresponds to a first field period, and a next 12 t corresponds to a second field period, and a last 16 t corresponds to a third field period. Further, during a period from 0 to 7 t in the first field period, a voltage of the control wiring Tim is high, so that the power source wiring PW (5) of FIG. 11 is connected to the current source circuit 2.

During this period, currents respectively corresponding to the first bit are supplied from the current source circuit 2 to the pixel circuits A1$j$ to A6$j$ via the power source wiring PW (5). At this time, voltages of the gate wirings G1 (5) to G6 (5) sequentially become high at every 1 t period in a corresponding manner as shown in FIG. 12, and voltages of the control wirings El (5) to E6 (5) sequentially become low at every 1 t period in a corresponding manner as shown in FIG. 12.

When the voltages of the gate wirings Gi (5) are high and the voltages of the control wirings Ei (5) are low, the pixel circuit Aij (5) is under such a condition that the TFT element Q14 and the TFT element Q16 conduct and the TFT element Q15 does not conduct, so that a current supplied from the current source circuit 2 flows through the power source wiring PW (5), the TFT element Q13, and the TFT element Q16, to the control wiring Ei (5).

At this time, a gate-source voltage of the TFT element Q13 is set so that the TFT element Q13 allows a current whose value has been predetermined to pass. This is based on the following reason: since more current is allowed to flow when a gate potential of the TFT element Q13 is low (when the gate-source voltage is large), a potential (source potential) of the power source wiring PW (5) drops, so that the gate-source voltage of the TFT element Q13 is adjusted so that a current supplied from the current source circuit 2 is allowed to flow. Further, this is based on also the following reason: since little current flows when the gate potential of the TFT element Q13 is high (when the gate-source voltage is low), a potential (source potential) of the power source wiring PW (5) rises, so that the gate-source voltage of the TFT element Q13 is adjusted so that a current supplied from the current source circuit 2 is allowed to flow. The gate-source voltage of the TFT element Q13 is set as an inter-terminal voltage of the capacitor C5.

Further, voltages of the gate wirings Gi (5) and the control wirings Ei (5) of the pixel circuits Aij (5) that have not been selected become low so that currents do not flow from the current source circuit 2 to two pixel circuits Aij (5), disposed in the same row, at the same time. Thus, it is possible to set values of the currents which flow to the pixel circuits Aij (5) disposed in the same row. When setting of the current values is completed, a voltage of the gate wiring Gi (5) of the pixel becomes low. At this time, the TFT elements Q14 and Q16 are turned OFF. Thus, the capacitor C5 retains the inter-terminal voltage.

In this manner, a period in which voltages of the gate wirings Gi (5) of the pixel circuits Aij (5) are high and voltages of the control wirings Ei (5) are low at 0 to 7 t in the first field period is a period for performing a first operation in which the current source circuit 2 is connected to the power source wiring PW (5) so as to set values of currents flowing to the organic EL elements EL5 of the respective pixels. The first operation is also such that: in order to make the pixel circuits Aij (5) store the currents which are allowed to flow to the organic EL elements EL5, the current is allowed to flow to the TFT element Q13 so as to cause the capacitor C5 to store electric charge in accordance with the current.

Further, a voltage of the control wiring Tim is low during a period of 8 t to 9 t in the first field period, so that the power source wiring PW (5) is connected to the voltage source circuit 6. At this time, voltages of the control wirings Ei (5) at all once become high under such condition that voltages of the gate wirings Gi (5) of the pixel circuit Aij (5) remain low. As a result, a current whose value has been set by the TFT element Q13 of each pixel circuit Aij (5) is allowed to flow to the organic EL element EL5. At this time, the TFT elements Q14 and Q16 remain OFF, and the TFT element Q15 conducts. Further, at this time, a current whose value has been set is allowed to flow to the organic EL element EL5 of each pixel regardless of a driving condition of the organic EL element EL5 of other pixel, that is, regardless of whether or not to allow the current to flow.

In this manner, a period of 8 t to 9 t in the first field period is a period for performing a second operation in which the voltage source circuit 6 is connected to the power source wiring PW (5) so as to allow a current, whose value has been set by performing the first operation, to flow to the organic EL element EL5 of each pixel. The second operation is also such that: after performing the first operation, a current stored in each pixel circuit Aij (5) is allowed to flow to the organic EL element EL5 via the TFT element Q13.

Next, in the second field period, a voltage of the control wiring Tim is high during a period of 10 t to 17 t, so that the power source wiring PW (5) is connected to the current source circuit 2. During this period, currents each of which corresponds to the second bit of each pixel Aij are supplied from the current source circuit 2 to the pixel circuits A1$j$ to A6$j$ via the power source wiring PW (5). At this time, voltages of the gate wirings G1 (5) to G6 (5) sequentially become high at every 1 t period in a corresponding manner as shown in FIG. 12, and voltages of the control wirings E1 (5) to E6 (5) are kept low.

In this manner, a period in which the voltage of the gate wiring Gi (5) of each pixel circuit Aij (5) is high and a voltage of the control wiring Ei (5) is low at 10 t to 17 t in the second field period is a period for performing the first operation in which the current source circuit 2 is connected to the power source wiring PW (5) so as to set a value of a current allowed to flow to the organic EL element EL5 of each pixel.

Further, a voltage of the control wiring Tim is low during a period of 18 t to 21 t in the second field period, so that the power source wiring PW (5) is connected to the voltage source circuit 6. At this time, voltages of the control wirings Ei (5) at all once become low under such condition that a voltage of the gate wiring Gi (5) of each pixel circuit Aij (5) remains low, so that the voltage source circuit 6 allows a current whose value has been set by the TFT element Q13 of each pixel circuit Aij (5) to flow to the organic EL element EL5. At this time, a current whose value has been set is allowed to flow to the organic EL element EL5 of each pixel regardless of a driving condition of the organic EL element EL5 of other pixel, that is, regardless of whether or not to allow the current to flow.

In this manner, a period of 18 t to 21 t in the second field period is a period for performing a second operation in which the voltage source circuit 6 is connected to the power source wiring PW (5) so as to allow a current, whose value has been set by performing the first operation, to flow to the organic EL element EL5 of each pixel.

Lastly, in the third field period, a voltage of the control wiring Tim is high during a period of 22 t to 29 t, so that the power source wiring PW (5) is connected to the current source circuit 2. During this time, currents each of which corresponds to the third bit of each pixel circuit Aij are supplied from the current source circuit 2 to the pixel circuits Alj to A6j via the power source wiring PW (5). At this time, voltages of the gate wirings GI (5) to G6(5) sequentially become high at every it period in a corresponding manner as shown in FIG. 12, and voltages of the control wirings E1 (5) to E6 (5) are kept low.

In this manner, a period in which a voltage of the control wiring Ei (5) is low under such condition that a voltage of the gate wiring Gi (5) of each pixel circuit Aij is high at 22 t to 29 t in the third field period is a period for performing the first operation in which the current source circuit 2 is connected to the power source wiring PW (5) so as to set a value of a current allowed to flow to the organic EL element EL5 of each pixel.

Further, a voltage of the control wiring Tim is low during a period of 30 t to 37 t in the third field period, so that the power source wiring PW (5) is connected to the voltage source circuit 6. At this time, voltages of the control wirings Ei (5) at all once become low under such condition that a voltage of the gate wiring Gi (5) of each pixel circuit Aij (5) remains low, so that the voltage source circuit 6 allows a current whose value has been set by the TFT element Q13 to flow to the organic EL element EL5. Further, at this time, a current whose value has been set is allowed to flow to the organic EL element EL5 of each pixel regardless of a driving condition of the organic EL element EL5 of other pixel, that is, regardless of whether or not to allow the current to flow.

In this manner, a period of 30 t to 37 t in the third field period is a period for performing the second operation in which the voltage source circuit 6 is connected to the power source wiring PW (5) so as to allow a current, whose value has been set by performing the first operation, to flow to the organic EL element EL5 of each pixel.

In the aforementioned driving method of the pixel circuit Aij (5), the current is not allowed to flow to the organic EL element EL5 at a period for performing the first operation, and the current is allowed to flow to the organic EL element EL5 only at a period for performing the second operation. Thus, a ratio of periods in which it is possible to emit light in the first to third field periods is equal to a ratio of the periods for performing the second operation, that is the ratio is 1:2:4.

In the pixel circuit Aij (5) according to the present embodiment, a single pixel (=a single dot) includes not only an organic EL element EL5 (ITO electrode which functions as an anode electrode) but also a power source wiring PW (5), a gate wiring Gi (5) and a control wiring Ei (5) (that is, two gate wirings), four TFT elements, and a capacitor C5. Further, the control wiring Ei (5) which functions as a gate wiring additionally provided unlike a conventional display device and the gate wiring Gi (5) cross the dots of RGB in the same manner as in illustration of FIG. 4. Besides, it is not necessary to provide a source wiring. Thus, even when the display device of the present invention has four TFT elements, it is possible to provide a wider ITO area (i.e., an organic EL area) than that of a conventional display device of FIG. 14 or a display device of FIG. 15 in which the pixel circuit is used. Thus, it is possible to reduce the luminance of the organic EL element ELS, thereby making the life of the organic EL element EL5 longer.

Further, as a result, it is possible to enlarge the dot width of whole the dots of RGB. In a process of providing droplets of RGB colors on banks formed by performing an inkjet process, the foregoing arrangement causes a target hole to be substantially in a circle shape, so that the arrangement is preferable.

As described above, according to the display device of the present embodiment, the display device includes a pixel circuit arrangement which allows a current whose value has been set to flow to the organic EL element EL5, and it is possible to enlarge an area of the transparent electrode.

It is obvious that other effects can be obtained as in Embodiment 1.

Embodiment 6

Figure 17:
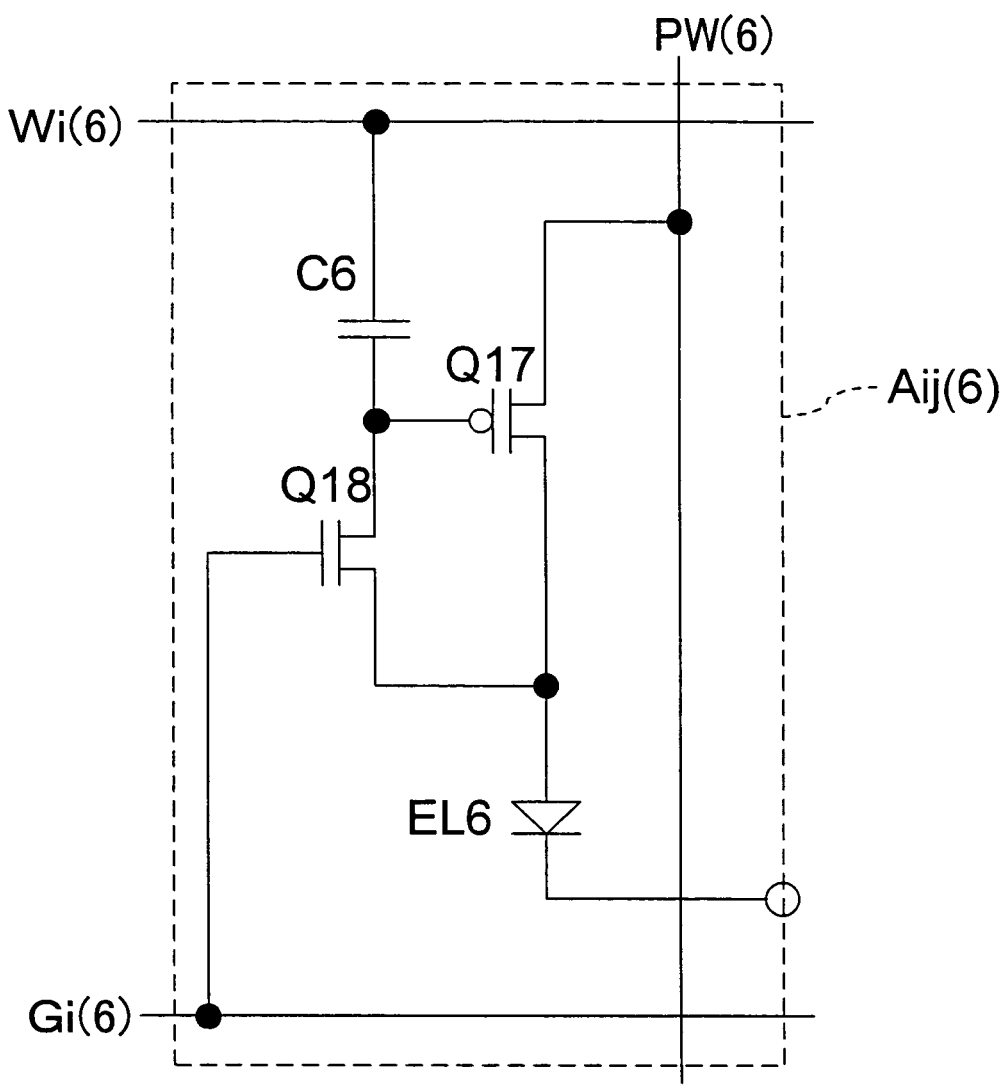
FIG. 17 is a circuit diagram showing an arrangement of a pixel circuit provided on a display device according to Embodiment 6 of the present invention.
Figure 18:
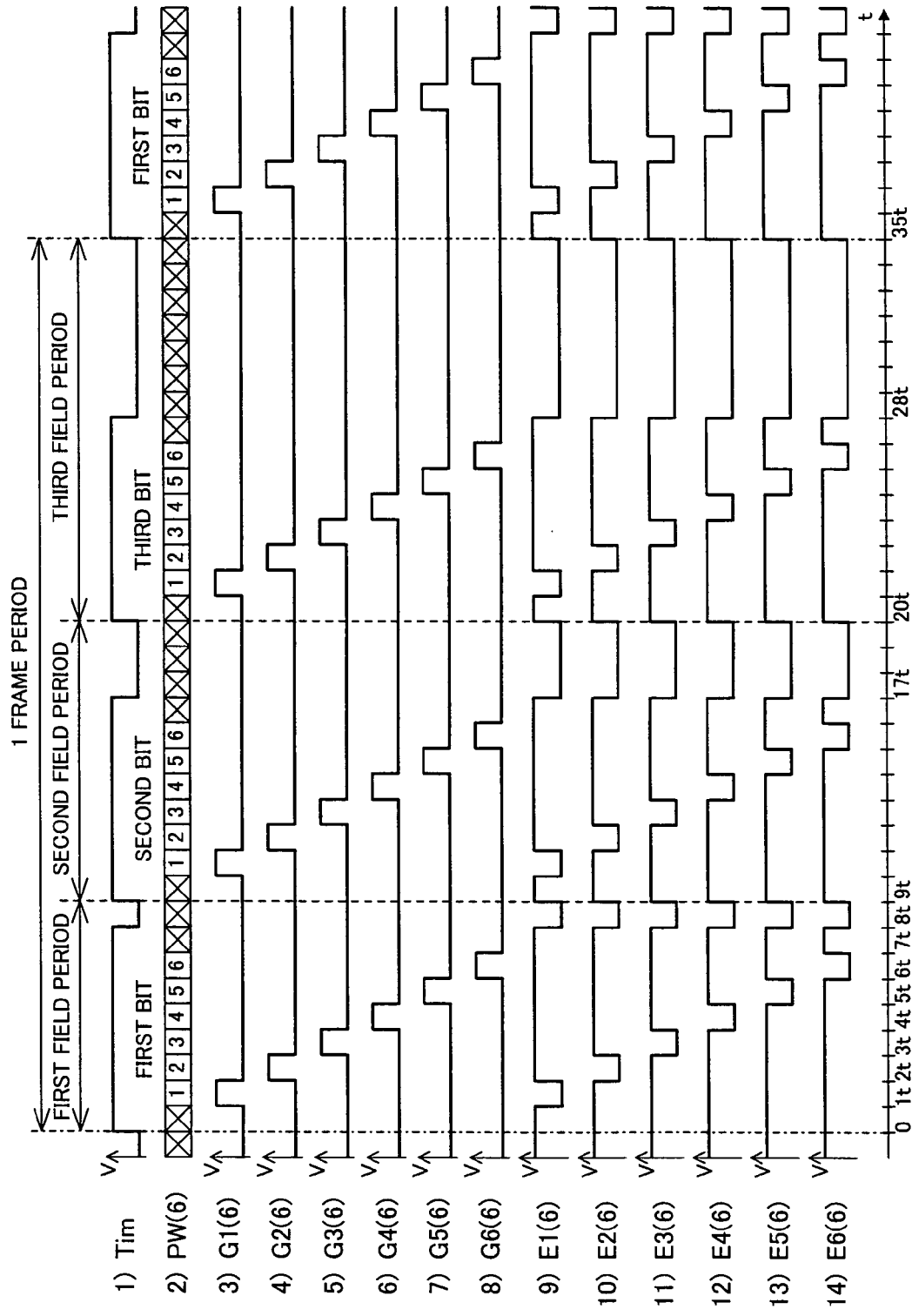
FIG. 18 is a timing chart showing operations of the display device according to Embodiment 6 of the present invention.

The following description will explain still another embodiment of the present invention with reference to FIG. 17 and FIG. 18. Note that, the same reference signs are given to components having the same functions as the components of the arrangements described in Embodiments 1 to 4, and description thereof is omitted.

FIG. 17 shows a pixel circuit Aij (6) of a display device according to the present embodiment. The pixel circuit Aij (6) is a single pixel, and if there are RGB pixels, the pixel circuit Aij (6) shows a single combination of the RGB pixels.

The pixel circuit Aij (6) includes: a current-driving-type organic EL element EL6; a p-type TFT element Q17, an n-type TFT element Q18; a capacitor C6; a gate wiring Gi (6); a power source wiring PW (6); and a control wiring Wi (6).

A source terminal of the TFT element (firstly-ordered active element, active element) Q17 is connected to the power source wiring (firstly-ordered wiring, wiring) PW (6), and the one terminal of the capacitor (electric charge retaining means) C6 and a source terminal of the TFT element (secondly-ordered active element) Q18 are connected to a gate terminal of the TFT element Q17. A gate terminal of the TFT element Q18 is connected to the gate wiring (secondly-ordered wiring) Gi (6). The other terminal of the capacitor C6 is connected to the control wiring (thirdly-ordered wiring) Wi (6), and an anode of the organic EL element (electro-optic element) EL6 is connected to drain terminals of the TFT elements Q17 and Q18.

The display device according to the present embodiment is arranged so that: in each pixel, a value of a current flowing to the organic EL element EL6 is set by using the foregoing elements and wirings, so as to drive the organic EL element EL6 on the basis of the current having the foregoing value. The power source wiring PW (6) is a wiring for allowing a current to flow to the organic EL element EL6. When the value of the current allowed to flow to the organic EL element EL6 is set, the TFT element Q18 conducts as described later. Thus, as apparent from the foregoing description, the TFT element Q17 is provided in series to the organic EL element EL6 so as to be positioned in a path for allowing the current to flow from the power source wiring PW (6) to the organic EL element EL6, and its gate terminal functions as a control terminal which controls the conductance. The lower a voltage applied to the gate terminal is, the smaller the conductance is. The higher a voltage applied to the gate terminal is, the larger the conductance is.

Further, the capacitor C6 applies a voltage corresponding to the stored electric charge to the gate terminal of the TFT element Q17 as a control voltage for controlling the resistance of the TFT element Q17 in the conduction. The TFT element Q18 is a switching element provided in a path for supplying the electric charge to the capacitor C6, and its gate terminal functions as a control terminal which allows/stops the conduction. When a high voltage is applied to the gate terminal, the TFT element Q18 conducts. When a low voltage is applied to the gate terminal, the TFT element Q18 does not conduct. While the TFT element Q18 conducts, the electric charge can be supplied to the capacitor C6, and while the TFT element Q18 does not conduct, the capacitor C6 retains the stored electric charge.

Further, the control wiring Wi (6) and the gate wiring Gi (6) cross the power source wiring PW (6) at right angle in each pixel, and the gate wiring Gi (6) applies a voltage determining a switching condition of the TFT element Q18 (control voltage which allows/stops the conduction) to the gate terminal of the TFT element Q18. The control wiring Wi (6) controls a terminal potential of the capacitor C6, and applies a voltage determining a switching condition of the TFT element Q17 (control voltage which allows/stops the conduction) to the gate terminal of the TFT element Q17.

Also the pixel circuit Aij (6) arranged in the foregoing manner constitutes a matrix of m×n as in the arrangement described in FIG. 2 of Embodiment 1 so as to realize the display device.

Next, a driving method of the display device is described as follows with reference to FIG. 18. Note that, also FIG. 18 corresponds to FIG. 3 of Embodiment 1. However, Ei (1) of FIG. 3 is changed to Wi (6) in FIG. 18.

As shown in FIG. 18, one frame period of the display device is a 35 t period which ranges from 0 to 34 t. A first 9 t corresponds to a first field period, and a next 1 it corresponds to a second field period, and a last 15 t corresponds to a third field period. Further, during a period of 0 to 7 t in the first field period, a voltage of the control wiring Tim is high, so that the power source wiring PW (6) of FIG. 17 is connected to the current source circuit 2.

During this period, currents respectively corresponding to the first bit are supplied from the current source circuit 2 to the pixel circuits A1j to A6j via the power source wiring PW (6). At this time, voltages of the gate wirings G1 (6) to G6 (6) sequentially become high at every it period in a corresponding manner as shown in FIG. 18, and voltages of the control wirings E1 (6) to E6 (6) sequentially become low at every 1 t period in a corresponding manner as shown in FIG. 18.

When the voltages of the gate wirings Gi (6) are high and the voltages of the control wirings Wi (6) are low, the pixel circuit Aij (6) is under such a condition that the TFT element Q18 conducts, so that a current supplied from the current source circuit 2 flows through the power source wiring PW (6) and the TFT element Q17 to the organic EL element EL6.

At this time, a gate-source voltage of the TFT element Q17 is set so that the TFT element Q17 allows a current whose value has been predetermined to pass. This is based on the following reason: since more current is allowed to flow when a gate potential of the TFT element Q17 is low (when the gate-source voltage is large), a drain potential of the TFT element Q17 rises, so that the gate-source voltage of the TFT element Q17 is adjusted by reducing the current so that a current supplied from the current source circuit 2 is allowed to flow. Further, this is based on also the following reason: since little current flows when the gate potential of the TFT element Q17 is high (when the gate-source voltage is low), a drain potential of the TFT element Q17 drops, so that the gate-source voltage of the TFT element 17 is adjusted by increasing the current so that a current supplied from the current source circuit 2 is allowed to flow.

The gate-source voltage of the TFT element Q17 is set on the basis of an inter-terminal voltage of the capacitor C6 and a voltage of the control wiring Wi (6). That is, a potential of the capacitor C6 connected to the gate terminal of the TFT element Q17 is obtained by adding the inter-terminal voltage of the capacitor C6 to a voltage (potential) of the control wiring Wi (6). Note that, a potential of the source terminal in the case where the TFT element Q17 conducts has a certain predetermined value since a constant current flows to the TFT element Q17 and the organic EL element EL6. Thus, the control voltage which the capacitor C6 applies to the gate terminal of the TFT element Q17 is a voltage corresponding to the electric charge stored in the capacitor C6. This voltage contains a voltage of the control wiring Wi (6) as a reference voltage which is a fraction thereof, and the control voltage is obtained by adding the inter-terminal voltage of the capacitor C6 to the reference voltage. In this manner, the control wiring Wi (6) provides the reference voltage which is a fraction of the control voltage to the capacitor C6. When the resistance of the TFT element Q17 in the conduction is set to stop the conduction, a sufficiently large control voltage is applied to the gate terminal, so that it is possible to realize the foregoing condition by enlarging the reference voltage for example.

Further, voltages of the gate wirings Gk (6) of an unselected (k≠i) pixel circuits Akj (6) are low and voltages of the gate wirings Wk (6) of an unselected (k≠i) pixel circuits Akj (6) are high so that a current does not flow from the current source circuit 2 to two pixel circuits Aij (6), disposed in the same row, at the same time. Thus, it is possible to respectively set values of the currents flowing to the pixel circuits Aij (6) disposed in the same row. When the setting of the values is completed, the gate wiring Gi (6) of the pixel is low, so that the TFT element Q18 does not conduct. Thus, the capacitor C6 retains the stored electric charge, and retains the inter-terminal voltage. Further, also a voltage of the control wiring Wi (6) is high. The potential of the control wiring Wi (6) changes from a low condition to a high condition and electric charge of the capacitor C6 is retained. Accordingly, potentials of both the terminals of the capacitor C6 rise. As a result, also a potential of the gate terminal of the TFT element Q17 rises, so that the TFT element Q17 is turned OFF. That is, when the reference voltage provided by the control wiring Wi (6) is appropriately varied from a low condition to a high condition, the conductance is made to substantially stop the conduction under such condition that the capacitor C6 retains the electric charge, so that it is possible to stop the current from flowing to the organic EL element EL6.

In this manner, a period in which voltages of the gate wirings Gi (6) of the pixel circuits Aij (6) are high and voltages of the control wirings Wi (6) are low at 0 to 7 t in the first field period is a period for performing a first operation in which the current source circuit 2 is connected to the power source wiring PW (6) so as to set values of currents flowing to the organic EL elements EL6 of the respective pixels. The first operation is also such that: in order to make the pixel circuits Aij (6) store the currents which are allowed to flow to the organic EL elements EL6, the current is allowed to flow to the TFT element Q17 so as to cause the capacitor C6 to store electric charge in accordance with the current.

Further, a voltage of the control wiring Tim is low during a period of 8 t in the first field period, so that the power source wiring PW (6) is connected to the voltage source circuit 6. At this time, voltages of the control wirings Wi (6) at all once become low under such condition that a voltage of the gate wiring Gi (6) of each pixel circuit Aij (6) remains low, so that the voltage source circuit 6 allows a current whose value has been set by the TFT element Q17 of each pixel circuit Aij (6) to flow to the organic EL element EL6. At this time, the TFT element Q18 remains OFF. That is, when a value of the reference voltage provided by the control wiring Wi (6) is restored to a condition enabling the path for supplying the electric charge to the capacitor C6 to supply the electric charge while keeping the TFT element Q18 OFF, it is possible to drive the organic EL element EL6 on the basis of the current whose value has been set. Further, at this time, a current whose value has been set is allowed to flow to the organic EL element EL6 of each pixel regardless of a driving condition of the organic EL element EL6 of other pixel, that is, regardless of whether or not to allow the current to flow.

In this manner, a period of 8 t in the first field period is a period for performing a second operation in which the voltage source circuit 6 is connected to the power source wiring PW (6) so as to allow a current, whose value has been set by performing the first operation, to flow to the organic EL element EL6 of each pixel. The second operation is also such that: after performing the first operation, a current stored in each pixel circuit Aij (6) is allowed to flow to the organic EL element EL6 via the TFT element Q17.

Next, in the second field period, a voltage of the control wiring Tim is high during a period of 9 t to 16 t, so that the power source wiring PW (6) is connected to the current source circuit 2. During this period, currents each of which corresponds to the second bit of each pixel Aij are supplied from the current source circuit 2 to the pixel circuits A1j to A6j via the power source wiring PW (6). At this time, voltages of the gate wirings G1 (6) to G6 (6) sequentially become high at every 1 t period in a corresponding manner as shown in FIG. 18, and voltages of the control wirings W1 (6) to W6 (6) sequentially become low at every it period in a corresponding manner as shown in FIG. 18.

In this manner, a period in which a voltage of the control wiring Wi (6) is low under such condition that a voltage of the gate wiring Gi (6) of each pixel circuit Aij is high at 9 t to 16 t in the second field period is a period for performing the first operation in which the current source circuit 2 is connected to the power source wiring PW (6) so as to set a value of a current allowed to flow to the organic EL element EL6 of each pixel.

Further, a voltage of the control wiring Tim is low during a period of 17 t to 19 t in the second field period, so that the power source wiring PW (6) is connected to the voltage source circuit 6. At this time, voltages of the control wirings Wi (6) at all once become low under such condition that a voltage of the gate wiring Gi (6) of each pixel circuit Aij (6) remains low, so that the voltage source circuit 6 allows a current whose value has been set by the TFT element Q17 to flow to the organic EL element EL6. Further, at this time, a current whose value has been set is allowed to flow to the organic EL element EL6 of each pixel regardless of a driving condition of the organic EL element EL6 of other pixel, that is, regardless of whether or not to allow the current to flow.

In this manner, a period of 17 t to 19 t in the second field period is a period for performing the second operation in which the voltage source circuit 6 is connected to the power source wiring PW (6) so as to allow a current, whose value has been set by performing the first operation, to flow to the organic EL element EL6 of each pixel.

Lastly, in the third field period, a voltage of the control wiring Tim is high during a period of 20 t to 27 t, so that the power source wiring PW (6) is connected to the current source circuit 2. During this time, currents each of which corresponds to the third bit of each pixel circuit Aij are supplied from the current source circuit 2 to the pixel circuits A1j to A6j via the power source wiring PW (6). At this time, voltages of the gate wirings G1 (6) to G6(6) sequentially become high at every 1 t period in a corresponding manner as shown in FIG. 18, and voltages of the control wirings W1 (6) to W6 (6) sequentially become high at every 1 t period in a corresponding manner as shown in FIG. 18.

In this manner, a period in which a voltage of the control wiring Wi (6) is low under such condition that a voltage of the gate wiring Gi (6) of each pixel circuit Aij is high at 20 t to 27 t in the third field period is a period for performing the first operation in which the current source circuit 2 is connected to the power source wiring PW (6) so as to set a value of a current allowed to flow to the organic EL element EL6 of each pixel.

Further, a voltage of the control wiring Tim is low during a period of 28 t to 34 t in the third field period, so that the power source wiring PW (6) is connected to the voltage source circuit 6. At this time, voltages of the control wirings Wi (6) at all once become low under such condition that a voltage of the gate wiring Gi (6) of each pixel circuit Aij (6) remains low, so that the voltage source circuit 6 allows a current whose value has been set by the TFT element Q17 to flow to the organic EL element EL6. Further, at this time, a current whose value has been set is allowed to flow to the organic EL element EL6 of each pixel regardless of a driving condition of the organic EL element EL6 of other pixel, that is, regardless of whether or not to allow the current to flow.

In this manner, a period of 28 t to 34 t in the third field period is a period for performing the second operation in which the voltage source circuit 6 is connected to the power source wiring PW (6) so as to allow a current, whose value has been set by performing the first operation, to flow to the organic EL element EL6 of each pixel.

In the aforementioned driving method of the pixel circuit Aij (6), the current is allowed to flow to the organic EL element EL6, at every 1 t period, also in a period for performing the first operation. Thus, a ratio of periods for performing the second operation in the first to third field periods is 1:3:7. However, a ratio of periods in which it is possible to emit light in each field is 1:2:4 that is a ratio obtained by adding the respective 1 t periods to each other.

In the pixel circuit Aij (6) according to the present embodiment, a single pixel (=a single dot) includes not only an organic EL element EL6 (ITO electrode which functions as an anode electrode) but also a power source wiring PW (6), a gate wiring Gi (6) and a control wiring Wi (6) (that is, two gate wirings), two TFT elements, and a capacitor C6. Further, in a case of a color display device, it is possible to provide the gate wiring Gi (6) and the control wiring Wi (6) so that they are shared by the RGB pixels. Thus, it is possible to omit two active elements from a conventional arrangement having four TFT pixel circuits, so that it is possible to enlarge an area of the transparent electrode (i.e., an organic EL area). Therefore, it is possible to reduce the luminance of the organic EL element EL6, thereby making the life of the organic EL element EL6 longer. Further, It is obvious that other effects can be obtained as in Embodiment 1.

As described above, the display device of the present invention sets a value of a current allowed to flow to an electro-optic element of each pixel so as to drive the electro-optic element on the basis of the current, wherein the pixel includes: a first wiring for allowing the current to flow to the electro-optic element; a first active element, provided in series to the electro-optic element so as to be positioned in a path for allowing the current to flow from the first wiring to the electro-optic element, which has a control terminal for controlling conductance of the first active element; a second active element, provided in series to the electro-optic element and the first active element so as to be positioned in the path, which has a control terminal for allowing/disallowing conduction; an electric charge retaining means for storing electric charge so as to apply a voltage corresponding to thus stored electric charge to the control terminal of the first active element as a control voltage for controlling the conductance of the first active element; a third active element, provided in a path for supplying the electric charge to the electric charge retaining means, which has a control terminal for allowing/disallowing conduction, said third active element causing the electric charge retaining means to retain the electric charge by disallowing conduction; a second wiring for applying a control voltage for allowing/disallowing conduction to the control terminal of the second active element; and a third wiring for applying a control voltage for allowing/disallowing conduction to the control terminal of the third active element.

Further, the display device of the present invention sets a value of a current allowed to flow to an electro-optic element of each pixel so as to drive the electro-optic element on the basis of the current, wherein the pixel includes: a first wiring for allowing the current to flow to the electro-optic element; a first active element, provided in series to the electro-optic element so as to be positioned in a path for allowing the current to flow from the first wiring to the electro-optic element, which has a control terminal for controlling conductance of the first active element; a second active element, provided in series to the electro-optic element and the first active element so as to be positioned in the path, which has a control terminal for allowing/disallowing conduction; an electric charge retaining means for storing electric charge so as to apply a voltage corresponding to thus stored electric charge to the control terminal of the first active element as a control voltage for controlling the conductance of the first active element; a third active element, provided in a path for supplying the electric charge to the electric charge retaining means, which has a control terminal for allowing/disallowing conduction, said third active element causing the electric charge retaining means to retain the electric charge by disallowing conduction; a second wiring for applying a control voltage for allowing/disallowing conduction to the control terminal of the second active element; a third wiring for applying a control voltage for allowing/disallowing conduction to the control terminal of the third active element; and a fourth active element, provided between (i) a connection point of the first active element and the second active element and (ii) the second wiring, said fourth active element having a control terminal, connected to the third wiring, which allows/disallows conduction.

Further, the display device of the present invention is arranged so that a current source circuit and a voltage source circuit are connected to the first wiring in a switchable manner.

According to the foregoing invention, in a case of setting a value of a current flowing to the electro-optic element of each pixel, the current source circuit is connected to the first wiring so as to set the value of the current flowing to the electro-optic element on the basis of a current flowing from the current source circuit, and thereafter, the voltage source circuit is connected to the first wiring by performing the switching operation so as to apply a voltage of the voltage source circuit, thereby driving the electro-optic element on the basis of the current whose value has been set during a period in which the second active element conducts regardless of a driving condition of an electro-optical element of other pixel.

Further, the display device of the present invention is arranged so that a first operation is performed, and a second operation is performed thereafter, said first operation being such that: the current source circuit is connected to the first wiring so as to set the value of the current allowed to flow to the electro-optic element of the pixel, said second operation being such that: the voltage source circuit is connected to the first wiring so as to allow the current whose value has been set by performing the first operation to flow to the electro-optic element of the pixel.

According to the arrangement, it is possible to set a value of a current flowing from the current source circuit to the electro-optic element of each pixel by performing the first operation, and thereafter, it is possible to allow the current, whose value has been set by performing the first operation, to the electro-optic element by performing the second operation, thereby driving the electro-optic element.

Further, the display device of the present invention is arranged so that the current source circuit outputs a plurality of current values, and the first operation and the second operation that is performed after the first operation are performed plural times at a predetermined period.

According to the invention, even when the number of current values which can be set so as to flow to the electro-optic element in each pixel by performing the first operation, that is, the number of current values which can be outputted from the current source circuit is limited to the number smaller than the number of tones that have been set, it is possible to make multiple tone display as follows. That is, the first operation and the second operation performed after the first operation are performed plural times at a predetermined period. This is equal to such operation that: current setting+light emission are performed plural times at a predetermined period. Thus, it is possible to display an image of tones, whose number exceeds the current value of the current flowing from the current source circuit, in accordance with a total length of periods in which the current flows to the electro-optic element at a predetermined period.

Particularly, in a case where the current source circuit connected to the first wiring is constituted of a TFT and the like, it is often that there is limit in the number of the current value which can be outputted from the current source circuit, that is, it is often that the number of the output current values is limited to two integral numbers including zero, so that the tone display of the present invention is effective.

Further, the display device of the present invention sets a value of a current allowed to flow to an electro-optic element of each pixel so as to drive the electro-optic element on the basis of the current, wherein the pixel includes: a firstly-ordered wiring for allowing the current to flow to the electro-optic element; a firstly-ordered active element, provided in series to the electro-optic element so as to be positioned in a path for allowing the current to flow from the first wiring to the electro-optic element, which has a control terminal for controlling conductance of the firstly-ordered active element; an electric charge retaining means for storing electric charge so as to apply a voltage corresponding to thus stored electric charge to the control terminal of the firstly-ordered active element as a control voltage for controlling the conduction of the firstly-ordered active element; a secondly-ordered active element, provided in a path for supplying the electric charge to the electric charge retaining means, which has a control terminal for allowing/disallowing conduction, said secondly-ordered active element causing the electric charge retaining means to retain the electric charge by disallowing conduction; a secondly-ordered wiring for applying a control voltage for allowing/disallowing conduction to the control terminal of the secondly-ordered active element; and a thirdly-ordered wiring for providing a reference voltage, which is a fraction of the voltage corresponding to the electric charge stored in the electric charge retaining means, to the electric charge retaining means.

Further, the display device of the present invention is arranged so that a current source circuit and a voltage source circuit are connected to the firstly-ordered wiring in a switchable manner.

Further, the display device of the present invention is arranged so that a first operation is performed, and a second operation is performed thereafter, said first operation being such that: the current source circuit is connected to the firstly-ordered wiring so as to set the value of the current allowed to flow to the electro-optic element of the pixel, said second operation being such that: the voltage source circuit is connected to the firstly-ordered wiring so as to allow the current whose value has been set by performing the first operation to flow to the electro-optic element of the pixel.

Further, also in the case of the foregoing arrangement, it is preferable that: the current source circuit outputs a plurality of current values, and the first operation and the second operation that is performed after the first operation are performed plural times at a predetermined period.

Further, the display device of the present invention sets a value of a current allowed to flow to an electro-optic element of each pixel so as to drive the electro-optic element on the basis of the current, wherein the pixel includes: a wiring for allowing the current to flow to the electro-optic element; an active element, provided in series to the electro-optic element so as to be positioned in a path for allowing the current to flow from the wiring to the electro-optic element, which has a control terminal for controlling conductance of the active element; and an electric charge retaining means for storing electric charge so as to apply a voltage corresponding to thus stored electric charge to the control terminal of the active element as a control voltage for controlling the conductance of the active element, and said display device includes: a current source circuit which outputs a constant current to the wiring so as to perform a first operation in which the electric charge retaining means is made to store electric charge corresponding to the current which has been allowed to flow to the active element so that a circuit of the pixel memorizes the current; and a voltage source circuit which outputs a low voltage so as to perform a second operation, in which the current memorized in the circuit is allowed to flow to the electro-optic element via the active element, after performing the first operation, said current source circuit and said voltage source circuit being provided in a switchable manner.

Further, also in the case of the foregoing arrangement, it is preferable that: the current source circuit outputs a plurality of current values, and the first operation and the second operation that is performed after the first operation are performed plural times at a predetermined period.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A display device, setting a value of a current allowed to flow to an electro-optic element of at least one pixel so as to drive the electro-optic element on the basis of the current, wherein the pixel includes:
   a first wiring for allowing the current to flow to the electro-optic element;
   a first active element, provided in series to the electro-optic element so as to be positioned in a path for allowing the current to flow from the first wiring to the electro-optic element, which has a control terminal for controlling conductance of the first active element;
   a second active element, provided in series to the electro-optic element and the first active element so as to be positioned in the path, which has a control terminal for allowing/disallowing conduction;
   an electric charge retaining section for storing electric charge so as to apply a voltage corresponding to thus stored electric charge to the control terminal of the first active element as a control voltage for controlling the conductance of the first active element;
   a third active element, provided in a path for supplying the electric charge to the electric charge retaining section, which has a control terminal for allowing/disallowing conduction, said third active element causing the electric charge retaining section to retain the electric charge by disallowing conduction, so that the pixel has only said first, second and third active elements;
   wherein a current source circuit and a voltage source circuit are connected to the first wiring in a switchable manner;
   a second wiring for applying a control voltage for allowing/disallowing conduction to the control terminal of the second active element; and
   a third wiring for applying a control voltage for allowing/disallowing conduction to the control terminal of the third active element.

2. The display device as set forth in claim 1, wherein a first operation is performed, and a second operation is performed thereafter, said first operation being such that: the current source circuit is connected to the first wiring so as to set the value of the current allowed to flow to the electro-optic element of the pixel, said second operation being such that: the voltage source circuit is connected to the first wiring so as to allow the current whose value has been set by performing the first operation to flow to the electro-optic element of the pixel.

3. The display device as set forth in claim 2, wherein:
the current source circuit outputs a plurality of current values, and
the first operation and the second operation that is performed after the first operation are performed plural times at a predetermined period.

4. The display device of claim 1, wherein the active elements comprise transistors.

5. A display device, setting a value of a current allowed to flow to an electro-optic element of each pixel so as to drive the electro-optic element on the basis of the current, wherein the pixel includes:
a firstly-ordered wiring for allowing the current to flow to the electro-optic element;
a firstly-ordered active element, provided in series to the electro-optic element so as to be positioned in a path for allowing the current to flow from the firstly-ordered wiring to the electro-optic element, which has a control terminal for controlling conduction of the firstly-ordered active element;
an electric charge retaining section for storing electric charge so as to apply a voltage corresponding to thus stored electric charge to the control terminal of the firstly-ordered active element as a control voltage for controlling the conductance of the firstly-ordered active element;
a secondly-ordered active element, provided in a path for supplying the electric charge to the electric charge retaining section, which has a control terminal for allowing/disallowing conduction, said secondly-ordered active element causing the electric charge retaining section to retain the electric charge by disallowing conduction, so that each pixel has only said firstly-ordered active element, said secondly-ordered active element and a thirdly-ordered active element;
wherein a current source circuit and a voltage source circuit are connected to the firstly-ordered wiring in a switchable manner;
a secondly-ordered wiring for applying a control voltage for allowing/disallowing conduction to the control terminal of the secondly-ordered active element; and
a thirdly-ordered wiring for providing a reference voltage, which is a fraction of the voltage corresponding to the electric charge stored in the electric charge retaining section, to the electric charge retaining section.

6. The display device as set forth in claim 5, wherein a first operation is performed, and a second operation is performed thereafter, said first operation being such that: the current source circuit is connected to the firstly-ordered wiring so as to set the value of the current allowed to flow to the electro-optic element of the pixel, said second operation being such that: the voltage source circuit is connected to the firstly-ordered wiring so as to allow the current whose value has been set by performing the first operation to flow to the electro-optic element of the pixel.

7. The display device as set forth in claim 6, wherein:
the current source circuit outputs a plurality of current values, and
the first operation and the second operation that is performed after the first operation are performed plural times at a predetermined period.

8. The display device of claim 5, wherein the active elements comprise transistors.

* * * * *